United States Patent
Murai et al.

(10) Patent No.: US 10,386,721 B2
(45) Date of Patent: Aug. 20, 2019

(54) PATTERN FORMATION METHOD AND ELECTRONIC DEVICE MANUFACTURED USING SAME

(71) Applicant: ADEKA CORPORATION, Tokyo (JP)

(72) Inventors: Toshihiko Murai, Tokyo (JP); Kenji Hara, Tokyo (JP); Masatomi Irisawa, Tokyo (JP)

(73) Assignee: ADEKA CORPORATION, Tokyo (JP)

( * ) Notice: Subject to any disclaimer, the term of this patent is extended or adjusted under 35 U.S.C. 154(b) by 0 days.

(21) Appl. No.: 15/551,736

(22) PCT Filed: Feb. 23, 2016

(86) PCT No.: PCT/JP2016/055281
§ 371 (c)(1),
(2) Date: Aug. 17, 2017

(87) PCT Pub. No.: WO2016/136752
PCT Pub. Date: Sep. 1, 2016

(65) Prior Publication Data
US 2018/0039179 A1    Feb. 8, 2018

(30) Foreign Application Priority Data
Feb. 26, 2015 (JP) .................................. 2015-037451

(51) Int. Cl.
| | | |
|---|---|---|
| G03F 7/11 | (2006.01) | |
| G03F 7/095 | (2006.01) | |
| G03F 7/20 | (2006.01) | |
| G03F 7/039 | (2006.01) | |
| G03F 7/16 | (2006.01) | |
| G03F 7/32 | (2006.01) | |

(52) U.S. Cl.
CPC ............ *G03F 7/11* (2013.01); *G03F 7/039* (2013.01); *G03F 7/095* (2013.01); *G03F 7/162* (2013.01); *G03F 7/168* (2013.01); *G03F 7/20* (2013.01); *G03F 7/2004* (2013.01); *G03F 7/32* (2013.01); *G03F 7/322* (2013.01)

(58) Field of Classification Search
CPC ....................................................... G03F 7/095
See application file for complete search history.

(56) References Cited

U.S. PATENT DOCUMENTS

| | | | |
|---|---|---|---|
| 2008/0032242 A1* | 2/2008 | Masuda ................ | G03F 7/0035 430/327 |
| 2014/0199637 A1 | 7/2014 | Hatakeyama et al. | |
| 2014/0227643 A1 | 8/2014 | Hatakeyama et al. | |
| 2015/0221881 A1 | 8/2015 | Iwai et al. | |
| 2016/0370646 A1 | 12/2016 | Nishiyama et al. | |

FOREIGN PATENT DOCUMENTS

| | | |
|---|---|---|
| JP | 6-326018 A | 11/1994 |
| JP | 6-349728 A | 12/1994 |
| JP | 2006-220863 A | 8/2006 |
| JP | 2013-164628 A | 8/2013 |
| JP | 2014-98889 A | 5/2014 |
| JP | 2014-137435 A | 7/2014 |
| JP | 2014-157179 A | 8/2014 |
| JP | 2014-178671 A | 9/2014 |
| WO | WO 2014/203794 A1 | 12/2014 |

OTHER PUBLICATIONS

International Search Report for PCT/JP2016/055281 dated May 24, 2016.
Written Opinion of the International Searching Authority for PCT/JP2016/055281 (PCT/ISA/237) dated May 24, 2016.

* cited by examiner

*Primary Examiner* — Kathleen Duda
(74) *Attorney, Agent, or Firm* — Birch, Stewart, Kolasch & Birch, LLP

(57) ABSTRACT

Provided are: a pattern-forming method by which a laminate that has excellent interlayer adhesion of a resist film, yields a high-definition pattern and exhibits excellent gas barrier properties and high solvent resistance is obtained; and an electronic device produced by the same. The pattern-forming method includes: the step (1) of forming a film using a composition on a support; the exposure step (2) of irradiating a prescribed part of the thus formed film with an active energy ray to modify the developability of the prescribed part; and the development step (3) of developing the film to obtain a pattern, wherein, a plurality of compositions that differ in solubility to a developing solution are used as the composition, and the resulting pattern has a multilayer structure.

12 Claims, 1 Drawing Sheet

PATTERN FORMATION METHOD AND ELECTRONIC DEVICE MANUFACTURED USING SAME

TECHNICAL FIELD

The present invention relates to a pattern-forming method, and an electronic device produced by the same. More particularly, the present invention relates to: a pattern-forming method by which a laminate that has excellent interlayer adhesion of a resist film, yields a high-definition pattern and exhibits excellent gas barrier properties and high solvent resistance is obtained; and an electronic device produced by the same.

In photolithography and screen printing, it is known that a variety of electronic devices can be obtained by patterning a resist.

For example, Patent Document 1 discloses a resist structure for pattern formation, in which a resist film, a water-soluble polymer film and another resist film are sequentially laminated on a substrate; Patent Document 2 discloses a resist pattern-forming method in which a lower-layer resist is surface-treated and an upper-layer resist is subsequently formed thereon; and Patent Documents 3 and 4 each disclose a black matrix which comprises coating films of black photosensitive resin compositions having different optical hardness.

RELATED ART DOCUMENTS

Patent Documents

Patent Document 1: Japanese Unexamined Patent Application Publication No. H6-326018
Patent Document 2: Japanese Unexamined Patent Application Publication No. H6-349728
Patent Document 3: Japanese Unexamined Patent Application Publication No. 2014-157179
Patent Document 4: WO 2014/203794

SUMMARY OF THE INVENTION

Problems to be Solved by the Invention

However, those resist patterns formed by the methods proposed in Patent Documents 1 to 4 are not necessarily satisfactory as the resist interlayer adhesion is not sufficient or a fine pattern cannot be obtained, and improvements are thus required in the future.

In view of this, an object of the present invention is to provide: a pattern-forming method by which a laminate that has excellent interlayer adhesion of a resist film, yields a high-definition pattern and exhibits excellent gas barrier properties and high solvent resistance is obtained; and an electronic device produced by the same.

Means for Solving the Problems

The present inventors intensively studied to solve the above-described problems and consequently discovered that the problems can be solved by adopting the below-described constitutions, thereby completing the present invention.

That is, the pattern-forming method of the present invention is characterized by comprising: the step (1) of forming a film using a composition on a support; the exposure step (2) of irradiating a prescribed part of the film with an active energy ray to modify the developability of the prescribed part; the development step (3) of developing the film to obtain a pattern, which steps (1) to (3) are repeatedly performed a plurality of times, wherein, a plurality of compositions that differ in solubility to a developing solution are used as the composition, and the resulting pattern has a multilayer structure.

In the pattern-forming method of the present invention, it is preferred that the uppermost layer of the multilayer structure be obtained from a water-developable photosensitive composition, an organic solvent-developable photosensitive composition, or an alkali-developable photosensitive composition. In the pattern-forming method of the present invention, it is also preferred that the plurality of compositions be at least two selected from the group consisting of a water-soluble composition, an organic solvent-soluble composition, an alkali-soluble composition, a water-developable photosensitive composition, an organic solvent-developable photosensitive composition and an alkali-developable photosensitive composition, and that at least the uppermost layer comprise a photosensitive composition. Further, in the pattern-forming method of the present invention, it is preferred that the step (1) be the step of coating the support with a lower layer composed of a water-soluble composition or a water-developable photosensitive composition and subsequently with an upper layer composed of an alkali-developable photosensitive composition or an organic solvent-developable photosensitive composition and the step (3) comprise: the development step of developing or dissolving the upper layer to obtain a pattern; and the development step of developing or dissolving the lower layer to obtain a pattern, or that the step (1) be the step of coating the support with a lower layer composed of an alkali-soluble composition, an alkali-developable photosensitive composition or an organic solvent-developable photosensitive composition and subsequently with an upper layer composed of a water-developable photosensitive composition, and the step (3) comprises: the development step of developing the upper layer to obtain a pattern; and the development step of subsequently developing the lower layer to obtain a pattern. Still further, it is preferred that the pattern-forming method of the present invention comprise the heating step between the step (1) and the step (2), and/or after the step (3).

Moreover, in the pattern-forming method of the present invention, it is preferred that the water-soluble composition comprise a binder resin and water and the organic solvent-soluble composition comprise a binder resin and an organic solvent; that at least either of the water-soluble composition and the organic solvent-soluble composition further comprise a cross-linking agent; that the cross-linking agent be an oxazoline compound or a carbodiimide compound; that the organic solvent-developable photosensitive composition comprise a radical polymerizable compound or a cationically polymerizable compound, and a polymerization initiator; that the alkali-developable photosensitive composition comprise, at least, an alkali-developable binder resin, a polymerization initiator and a solvent; and that the water-developable photosensitive composition comprise a photosensitive group-containing water-soluble polymer and water. Still further, in the pattern-forming method of the present invention, it is preferred that the active energy ray have an energy of 0.1 to 500,000 mJ/cm$^2$; and that the multilayer structure of the resulting pattern have a film thickness of 0.1 to 1,000 μm, a line width of 1 to 1,000 μm and a spacing of 1 to 1,000 μm. Yet still further, in the pattern-forming method of the present invention, it is preferred that the film thickness ratio of the upper layer and the lower layer be 0.1:99.9 to 99.9:0.1.

The electronic device of the present invention is characterized by comprising a pattern formed by the pattern-forming method of the present invention.

Effects of the Invention

According to the present invention, a pattern-forming method by which a laminate that has excellent interlayer adhesion of a resist film, yields a high-definition pattern and exhibits excellent gas barrier properties and high solvent resistance is obtained, as well as an electronic device produced by the same, can be provided.

BRIEF DESCRIPTION OF THE DRAWING

FIG. 1A shows a pattern in which a first layer and a second layer are laminated on a substrate at substantially the same width; FIG. 1B shows a pattern in which the first layer and the second layer are laminated on the substrate in a tapered shape; and FIG. 1C shows a pattern in which the first layer and the second layer are laminated on the substrate in a reverse-tapered shape.

MODE FOR CARRYING OUT THE INVENTION

Figure 1:
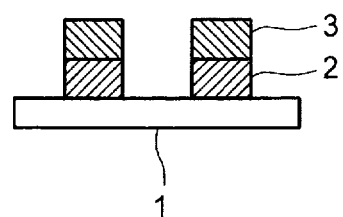
FIG. 1 provides cross-sectional views schematically showing examples of a pattern having a bilayer structure produced by the pattern-forming method of the present invention.
Figure 1:
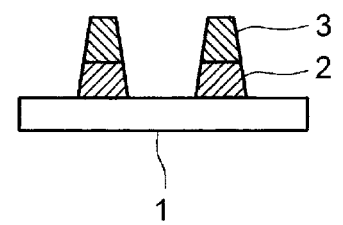
Figure 1:
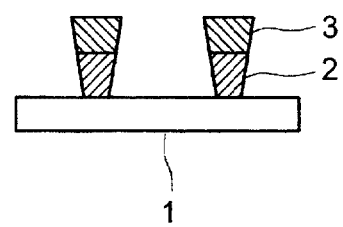

The pattern-forming method of the present invention will now be described in detail.

The pattern-forming method of the present invention comprises: the step (1) of forming a film using a composition on a support; the exposure step (2) of irradiating a prescribed part of the film with an active energy ray to modify the developability of the prescribed part; and the development step (3) of developing the film to obtain a pattern. In the pattern-forming method of the present invention, as the composition, a plurality of compositions that differ in solubility to a developing solution are used, and the resulting pattern has a multilayer structure.

In a preferred embodiment of the present invention, a process of coating and then drying a layer, which is composed of plural compositions that differ in solubility to a developing solution, on a support is repeatedly performed as the step (1); a prescribed part of the resulting film is subsequently exposed by irradiation with an active energy ray as the step (2); and the film is repeatedly treated with a plurality of developing solutions as the step (3).

In another embodiment of the pattern-forming method of the present invention, a series of the steps (1), (2) and (3) is repeated a plurality of times. The solubility of the composition used in the step (1) to a developing solution varies for each series; and the developing solution used for the development in the step (3) also varies for each series.

In yet another embodiment of the pattern-forming method of the present invention, as the step (1), a film is formed by coating and then drying a lower layer composed of a composition on a support and subsequently laminating thereon a film obtained from another composition as an upper layer, and the compositions constituting the upper layer and the lower layer are different from each other in terms of the solubility to a developing solution. Thereafter, a prescribed part of the thus formed film is exposed by irradiation with an active energy ray as the step (2) and subsequently, the film is repeatedly treated with a plurality of developing solutions as the step (3).

In the pattern-forming method of the present invention, after a film is formed in the step (1), the resulting film may be subjected to the heating step as a pre-curing process before the exposure in the step (2), or as a post-curing process after the development in the step (3).

Examples of a heating method include a method of heating a laminate on a hot plate; a proximity method, an adsorption method and a conveyor method, which employ a heating apparatus such as a thermal head or a clean oven; and a combination thereof. The heating is preferably performed at 50 to 200° C. for several seconds to 1 hour.

As a method of coating a composition for the film formation, any known method can be employed, and examples thereof include a variety of known means for printing, immersion and the like, such as curtain coating, extrusion coating, roll coating, spin coating, dip coating, bar coating, die coating, curtain coating, spray coating, slide coating, blade coating, gravure coating, print coating, knife coating, fountain reverse coating and electrostatic coating.

As the film, one which is obtained by coating and then drying a composition on other support and subsequently peeling off the resulting film from the support, for example, a dry film, can be used.

Examples of the support include supports made of cellulose esters (e.g., diacetyl cellulose, triacetyl cellulose (TAC), propionyl cellulose, butyryl cellulose, acetylpropionyl cellulose and nitrocellulose), polyamides, polycarbonates, polyesters (e.g., polyethylene terephthalate, polyethylene naphthalate, polybutylene terephthalate, poly-1,4-cyclohexane dimethylene terephthalate, polyethylene-1,2-diphenoxyethane-4,4'-dicarboxylate and polybutylene terephthalate), polystyrenes, polyolefins (e.g., polyethylene, polypropylene and polymethylpentene), acrylic resins (e.g., polymethyl methacrylate), polycarbonates, polysulfones, polyether sulfones, polyether ketones, polyether imides, polyoxyethylenes, polymer materials (e.g., norbornene resins), metals, wood, rubbers, plastics, soda glass, and quartz glass; ceramic products; papers; canvases; and semiconductor substrates.

In the present invention, as the composition, a solvent-soluble composition, an alkali-soluble composition, a solvent-developable photosensitive composition or an alkali-developable photosensitive composition can be used, and a photosensitive composition is used for at least the uppermost layer.

In the present invention, the solvent-soluble composition comprises a binder resin and, as required, the below-described radical polymerizable compound and/or solvent.

Examples of the binder resin include polyolefin-based polymers, such as polyethylene, polypropylene and polyisobutylene; diene-based polymers, such as polybutadiene and polyisoprene; polymers having a conjugated polyene structure, such as polyacetylene polymers and polyphenylene polymers; vinyl polymers, such as polyvinyl chloride, polystyrene, vinyl acetate, polyvinyl alcohols, polyacrylic acid, polyacrylate, polyacrylamide, polyacrylonitrile and polyvinyl phenol; polyethers, such as polyphenylene ether, polyoxirane, polyoxetane, polytetrahydrofuran, polyether ketone, polyether ether ketone and polyacetal; phenol resins, such as novolac resin and resol resin; polyesters, such as polyethylene terephthalate, polyphenolphthalein terephthalate, polycarbonate, alkyd resins and unsaturated polyester resins; polyamides, such as nylon-6, nylon-66, water-soluble nylons and polyphenylene amide; polypeptides, such as gelatin and casein; epoxy resins and modified products thereof, such as novolac epoxy resins, bisphenol epoxy resins, novolac epoxy acrylate and acid anhydride-modified resins; polyurethanes; polyimides; melamine resins; urea resins; polyimidazoles; polyoxazoles; polypyrroles; polyanilines; polysulfides; polysulfones; and celluloses.

The polystyrene-equivalent weight-average molecular weight (Mw) of the binder resin, which is determined by gel permeation chromatography (GPC), is usually 1,000 to 500,000, preferably 2,000 to 200,000, more preferably 3,000 to 100,000. In this case, when the Mw of the binder resin is less than 1,500, the heat resistance of the resulting film tends to be reduced, whereas when the Mw is higher than 300,000, the developability and coatability of the resulting film tends to be deteriorated.

Examples of the solvent include ketones, such as methyl ethyl ketone, methyl amyl ketone, diethyl ketone, acetone, methyl isopropyl ketone, methyl isobutyl ketone, cyclopentanone, cyclohexanone and isophorone; ether solvents, such as ethyl ether, dioxane, tetrahydrofuran, 1,2-dimethoxyethane, 1,2-diethoxyethane and dipropylene glycol dimethyl ether; ester solvents, such as methyl acetate, ethyl acetate, n-propyl acetate, isopropyl acetate and n-butyl acetate; dibasic acid esters, such as dimethyl succinate, diethyl succinate, dimethyl adipate, diethyl adipate, dimethyl glutarate and diethyl glutarate; cellosolve solvents, such as ethylene glycol monomethyl ether, ethylene glycol monoethyl ether, propylene glycol monomethyl ether acetate (PGMEA) and cellosolve acetate; alcohol solvents, such as methanol, ethanol, iso- or n-propanol, iso- or n-butanol, amyl alcohols and acetone alcohols; ether ester solvents, such as ethylene glycol monomethyl ether acetate and ethylene glycol monoethyl ether acetate; BTX solvents, such as benzene, toluene and xylene; aliphatic hydrocarbon solvents, such as hexane, heptane, octane and cyclohexane; terpene hydrocarbon oils, such as turpentine oil, D-limonene and pinene; paraffin-based solvents, such as mineral spirit, SWASOL #310 (manufactured by COSMO Matsuyama Oil Co., Ltd.) and SOLVESSO #100 (manufactured by Exon Chemical Co., Ltd.); halogenated aliphatic hydrocarbon solvents, such as carbon tetrachloride, chloroform, trichloroethylene, methylene chloride and 1,2-dichloroethane; halogenated aromatic hydrocarbon solvents, such as chlorobenzene; aprotic polar solvents, such as N,N-dimethylformamide, N-methylpyrrolidone and dimethyl sulfoxide; dialkylamide; carbitol solvents; aniline; triethylamine; pyridine; acetic acid; acetonitrile; carbon disulfide; and water. These solvents may be used individually, or two or more thereof may be used in combination as a mixed solvent.

In the solvent-soluble composition which contains water as the solvent, it is preferred to use a water-soluble polymer as the binder resin. Examples of the water-soluble polymer include polyvinyl alcohols, polyvinyl alcohol derivatives modified with a silanol group or the like; oxidized starch; etherified, esterified or grafted modified starch; cellulose derivatives such as gelatin, casein and carboxymethylcellulose; polyvinylpyrrolidones; water-soluble polyester resins, water-soluble polyacrylic acid ester resins (e.g., 2-hydroxypropyl acrylate polymers and 4-hydroxybutyl acrylate polymers), water-soluble polycarbonate resins, water-soluble polyvinyl acetate resins, water-soluble styrene acrylate resins, water-soluble vinyltoluene acrylate resins, water-soluble polyurethane resins, water-soluble polyamide resins (e.g., polyvinylamide, polyacrylamide and modified acrylamide), water-soluble urea resins, water-soluble polycaprolactone resins, water-soluble polystyrene resins, water-soluble polyvinyl chloride resins, water-soluble polyacrylate resins, water-soluble resins, such as water-soluble polyacrylonitrile resins; and water-soluble polymers, such as styrene-butadiene copolymers, acrylate copolymers, polyvinyl acetates and ethylene-vinyl acetate copolymers.

As the water-soluble polymer, a commercially available one can be used as well, and examples thereof include GOHSENOL Series, GOHSENX Z Series and NICHIGO G-POLYMER (which are manufactured by The Nippon Synthetic Chemical Industry Co., Ltd.); BIOSURFINE-AWP (manufactured by Toyo Gosei Co., Ltd.); SUMIKA GEL Series (manufactured by Sumitomo Chemical Co., Ltd.); JURYMER Series (manufactured by Toagosei Co., Ltd.); AQUALIC L Series (manufactured by Nippon Shokubai Co., Ltd.); PITZCOL Series (manufactured by DKS Co., Ltd.); AQ NYLON Series (manufactured by Toray Industries, Inc.); KURARAY POVAL (manufactured by Kuraray Co., Ltd.); and SP-1200, SP-1400, SP-7000, AQUASOL Series, SP-8305, ONEPOT Series, MSP-2 and SP-PRO (photosensitive materials, manufactured by Murakami Co., Ltd.).

As the solvent-soluble composition, one which contains a radical polymerizable compound, a radical polymerization initiator and, as required, a solvent can also be used and, when the polymerization initiator is a thermal radical polymerization initiator, the polymerization reaction is carried out by heating so as to form a film. When the polymerization initiator is a photoradical polymerization initiator, the solvent-soluble composition is a solvent-developable photosensitive composition, and the polymerization reaction is carried out by irradiating the composition with an active energy ray so as to form a film.

The radical polymerizable compound is not particularly restricted and may be any conventionally used one, and examples thereof include unsaturated aliphatic hydrocarbons, such as ethylene, propylene, butylene, isobutylene, vinyl chloride, vinylidene chloride, vinylidene fluoride and tetrafluoroethylene; (meth)acrylic acid, α-chloroacrylic acid, itaconic acid, maleic acid, citraconic acid, fumaric acid, himic acid, crotonic acid, isocrotonic acid, vinylacetic acid, allylacetic acid, cinnamic acid, sorbic acid, mesaconic acid, mono[2-(meth)acryloyloxyethyl]succinate, mono[2-(meth)acryloyloxyethyl]phthalate, and mono(meth)acrylates of a polymer having a carboxyl group and a hydroxyl group at both terminals, such as ω-carboxypolycaprolactone mono(meth)acrylate; unsaturated polybasic acids, such as hydroxyethyl (meth)acrylate-malate, hydroxypropyl (meth)acrylate-malate, dicyclopentadiene-malate, and a polyfunctional (meth)acrylate having one carboxyl group and two or more (meth)acryloyl groups; esters formed between an unsaturated monobasic acid and a polyhydric alcohol or a polyhydric phenol, such as 2-hydroxyethyl (meth)acrylate, 2-hydroxypropyl (meth)acrylate, glycidyl (meth)acrylate, the below-described Compound Nos. A1 to A4, methyl (meth)acrylate, butyl (meth)acrylate, isobutyl (meth)acrylate, t-butyl (meth)acrylate, cyclohexyl (meth)acrylate, n-octyl (meth)acrylate, isooctyl (meth)acrylate, isononyl (meth)acrylate, stearyl (meth)acrylate, lauryl (meth)acrylate, methoxyethyl (meth)acrylate, dimethylaminomethyl (meth)acrylate, dimethylaminoethyl (meth)acrylate, aminopropyl (meth)acrylate, dimethylaminopropyl (meth)acrylate, ethoxyethyl (meth)acrylate, poly(ethoxy)ethyl (meth)acrylate, butoxyethoxyethyl (meth)acrylate, ethylhexyl (meth)acrylate, phenoxyethyl (meth)acrylate, tetrahydrofuryl (meth)acrylate, vinyl (meth)acrylate, allyl (meth)acrylate, benzyl (meth)acrylate, ethylene glycol di(meth)acrylate, diethylene glycol di(meth)acrylate, triethylene glycol di(meth)acrylate, polyethylene glycol di(meth)acrylate, propylene glycol di(meth)acrylate, 1,4-butanediol di(meth)acrylate, 1,6-hexanediol di(meth)acrylate, trimethylolethane tri(meth)acrylate, trimethylolpropane tri(meth)acrylate, dipentaerythritol hexa(meth)acrylate, dipentaerythritol penta(meth)acrylate, pentaerythritol tetra(meth)acrylate, pentaerythritol tri(meth)acrylate, tricyclodecane dimethylol di(meth)acrylate, tri[meth)acryloylethyl]isocyanurate and polyester (meth)acrylate oligomers; metal salts of unsaturated polybasic acids, such as zinc (meth)acrylate and magnesium (meth)acrylate; unsaturated polybasic acid anhydrides, such as maleic anhydride, itaconic anhydride, citraconic anhydride, methyltetrahydrophthalic anhydride, tetrahydrophthalic anhydride, trialkyltetrahydrophthalic anhydrides, 5-(2,5-dioxotetrahydrofuryl)-3-methyl-3-cyclohexene-1,2-dicarboxylic acid anhydride, trialkyltetrahydrophthalic anhydride-maleic anhydride adducts, dodecenylsuccinic anhydride and methylhimic anhydride; amides of an unsaturated monobasic acid and a polyfunctional amine, such as (meth)acrylamide, methylene-bis(meth)acrylamide, diethylenetriamine-tris(meth)acrylamide, xylylene-bis(meth)acrylamide, α-chloroacrylamide and N-2-hydroxyethyl(meth)acrylamide; unsaturated aldehydes, such as acrolein; unsaturated nitriles, such as (meth)acrylonitrile, α-chloroacrylonitrile, vinylidene cyanide and allyl cyanide; unsaturated aromatic compounds, such as styrene, 4-methylstyrene, 4-ethylstyrene, 4-methoxystyrene, 4-hydroxystyrene, 4-chlorostyrene, divinylbenzene, vinyltoluene, vinylbenzoic acid, vinylphenol, vinylsulfonic acid, 4-vinylbenzenesulfonic acid, vinylbenzyl methyl ether and vinylbenzyl glycidyl ether; unsaturated ketones, such as methyl vinyl ketone; unsaturated amine compounds, such as vinylamine, allylamine, N-vinylpyrrolidone and vinylpiperidine; vinyl alcohols, such as allyl alcohol and crotyl alcohol; vinyl ethers, such as vinylmethyl ether, vinylethyl ether, n-butylvinyl ether, isobutylvinyl ether and allyl glycidyl ether; unsaturated imides, such as maleimide, N-phenylmaleimide and N-cyclohexylmaleimide; indenes, such as indene and 1-methylindene; aliphatic conjugated dienes, such as 1,3-butadiene, isoprene, and chloroprene; macromonomers having a mono(meth)acryloyl group at a terminal of a polymeric molecular chain, such as polystyrene, polymethyl (meth)acrylate, poly-n-butyl (meth)acrylate and polysiloxanes; vinyl chloride; vinylidene chloride; divinyl succinate; diallyl phthalate; triallyl phosphate; triallyl isocyanurate; vinyl thioether; vinylimidazole; vinyloxazoline; vinylcarbazole; vinylpyrrolidone; vinylpyridine; vinylurethane compounds formed by a hydroxyl group-containing vinyl monomer and a polyisocyanate compound; and vinylepoxy compounds formed by a hydroxyl group-containing vinyl monomer and a polyepoxy compound.

These radical polymerizable compounds may be used individually or in combination of two or more thereof and, when two or more radical polymerizable compounds are used in combination, they may be copolymerized in advance to be used as a copolymer.

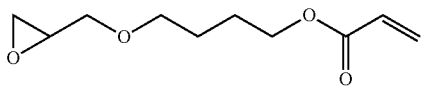

Compound No. A1

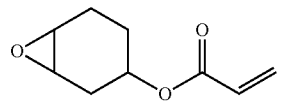

Compound No. A2

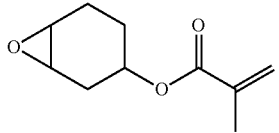

Compound No. A3

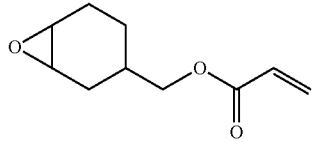

Compound No. A4

Examples of the thermal radical polymerization initiator include azo-based initiators, such as 2,2'-azobisisobutyronitrile, 2,2'-azobis(methylisobutyrate), 2,2'-azobis-2,4-dimethylvaleronitrile and 1,1'-azobis(1-acetoxy-1-phenylethane); peroxide-based initiators, such as benzoyl peroxide, di-t-butylbenzoyl peroxide, t-butylperoxypivalate and di(4-t-butylcyclohexyl)peroxydicarbonate; and persulfates, such as ammonium persulfate, sodium persulfate and potassium persulfate. These thermal radical polymerization initiators may be used individually or in combination of two or more thereof.

The photoradical polymerization initiator may be any compound as long as it is capable of initiating radical polymerization upon irradiation with light, and preferred examples thereof include ketone-based compounds, such as acetophenone-based compounds, benzyl-based compounds, benzophenone-based compounds and thioxanthone-based compounds; acylphosphine oxide-based compounds; and oxime-based compounds.

Examples of the acetophenone-based compounds include diethoxyacetophenone, 2-hydroxy-2-methyl-1-phenylpropan-1-one, 4'-isopropyl-2-hydroxy-2-methylpropiophenone, 2-hydroxymethyl-2-methylpropiophenone, 2,2-dimethoxy-1,2-diphenylethane-1-one, p-dimethylaminoacetophenone, p-tert-butyldichloroacetophenone, p-tert-butyltrichloroacetophenone, p-azidobenzalacetophenone, 1-hydroxycyclohexylphenyl ketone, 2-methyl-1-[4-(methylthio)phenyl]-2-morpholinopropanon-1, 2-benzyl-2-dimethylamino-1-(4-morpholinophenyl)-butanone-1, benzoin, benzoin methyl ether, benzoin ethyl ether, benzoin isopropyl ether, benzoin-n-butyl ether, benzoin isobutyl ether, and 1-[4-(2-hydroxyethoxy)-phenyl]-2-hydroxy-2-methyl-1-propan-1-one.

Examples of the benzyl-based compounds include benzyl and anisyl.

Examples of the benzophenone-based compounds include benzophenone, methyl o-benzoylbenzoate, Michler's ketone, 4,4'-bisdiethylaminobenzophenone, 4,4'-dichlorobenzophenone, and 4-benzoyl-4'-methyldiphenyl sulfide.

Examples of the thioxanthone-based compounds include thioxanthone, 2-methylthioxanthone, 2-ethylthioxanthone, 2-chlorothioxanthone, 2-isopropylthioxanthonem and 2,4-diethylthioxanthone.

Examples of the acylphosphine oxide-based compounds include 2,4,6-trimethylbenzoyl-diphenyl-phosphine oxide, ethyl(2,4,6-trimethylbenzoyl)phenyl phosphinate, bis(2,4,6-trimethylbenzoyl)-phenyl phosphine oxide, and bis(2,4,6-trimethylbenzoyl)(2-methylprop-1-yl)phosphine oxide.

As the oxime-based compounds, compounds represented by the following Formula (I) are particularly preferred because of their sensitivity.

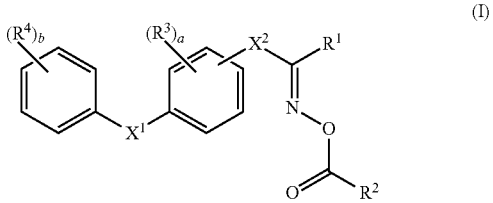

In the Formula (I), $R^1$ and $R^2$ each independently represent a hydrogen atom, a cyano group, an alkyl group having 1 to 20 carbon atoms, an aryl group having 6 to 30 carbon atoms, an arylalkyl group having 7 to 30 carbon atoms, or a heterocyclic group having 2 to 20 carbon atoms.

$R^3$ and $R^4$ each independently represent a halogen atom, a nitro group, a cyano group, a hydroxyl group, a carboxyl group, $R^5$, $OR^6$, $SR^7$, $NR^8R^9$, $COR^{10}$, $SOR^{11}$, $SO_2R^{12}$ or $CONR^{13}R^{14}$, and $R^3$ and $R^4$ are optionally bound with each other to form a ring.

$R^5$, $R^6$, $R^7$, $R^8$, $R^9$, $R^{10}$, $R^{11}$, $R^{12}$, $R^{13}$ and $R^{14}$ each independently represent an alkyl group having 1 to 20 carbon atoms, an aryl group having 6 to 30 carbon atoms, an arylalkyl group having 7 to 30 carbon atoms, or a heterocyclic group having 2 to 20 carbon atoms.

$X^1$ represents an oxygen atom, a sulfur atom, a selenium atom, $CR^{15}R^{16}$, CO, $NR^{17}$ or $PR^{18}$, and $X_2$ represents a single bond or CO.

$R^1$, $R^2$, $R^5$, $R^6$, $R^7$, $R^8$, $R^9$, $R^{10}$, $R^{15}$, $R^{16}$, $R^{17}$ and $R^{18}$ each represent an alkyl group having 1 to 20 carbon atoms, an aryl group having 6 to 30 carbon atoms, or an arylalkyl group having 7 to 30 carbon atoms; a methylene group in the alkyl group or arylalkyl group may be substituted with a halogen atom, a nitro group, a cyano group, a hydroxyl group, a carboxyl group or a heterocyclic group and interrupted by —O—; $R^3$ and $R^4$ may each independently be bound with any adjacent benzene ring to form a ring; a represents an integer of 0 to 4; and b represents an integer of 0 to 5.

These photoradical polymerization initiators may be incorporated individually or in combination of two or more thereof, in accordance with the desired performance.

As the solvent-soluble composition, one which contains a cationically polymerizable compound, a cationic polymerization initiator and, as required, a solvent can also be used and, when the polymerization initiator is a thermal cationic polymerization initiator, the polymerization reaction is carried out by heating so as to form a film. When the polymerization initiator is a photocationic polymerization initiator, the solvent-soluble composition is a solvent-developable photosensitive composition, and the polymerization reaction is carried out by irradiating the composition with an active energy ray so as to form a film.

As the cationically polymerizable compound, a cationically polymerizable compound whose polymerization or cross-linking reaction is induced by a cationic polymerization initiator activated by irradiation with light or heat may be used individually or in combination of two or more thereof. Representative examples of the cationically polymerizable compound include epoxy compounds, oxetane compounds, cyclic lactone compounds, cyclic acetal compounds, cyclic thioether compounds, spiro-orthoester compounds and vinyl compounds, and one or more of these compounds can be used. Thereamong, epoxy compounds and oxetane compounds are suitable because of their availability and ease of handling.

As the epoxy compounds, for example, alicyclic epoxy compounds, aromatic epoxy compounds and aliphatic epoxy compounds are suitable.

Specific examples of the alicyclic epoxy compounds include polyglycidyl ethers of polyhydric alcohols having at least one alicyclic ring; and cyclohexene oxide or cyclopentene oxide-containing compounds obtained by epoxidation of a cyclohexene ring or cyclopentene ring-containing compound with an oxidizing agent. Examples of these compounds include hydrogenated bisphenol-A diglycidyl ether, 3,4-epoxycyclohexylmethyl-3,4-epoxycyclohexane carboxylate, 3,4-epoxy-1-methylcyclohexyl-3,4-epoxy-1-methylcyclohexane carboxylate, 6-methyl-3,4-epoxycyclohexylmethyl-6-methyl-3,4-epoxycyclohexane carboxylate, 3,4-epoxy-3-methylcyclohexylmethyl-3,4-epoxy-3-methylcyclohexane carboxylate, 3,4-epoxy-5-methylcyclohexylmethyl-3,4-epoxy-5-methylcyclohexane carboxylate, 2-(3,4-epoxycyclohexyl-5,5-spiro-3,4-epoxy)cyclohexane-metadioxane, bis(3,4-epoxycyclohexylmethyl)adipate, 3,4-epoxy-6-methylcyclohexyl carboxylate, methylene-bis(3,4-epoxycyclohexane), dicyclopentadiene diepoxide, ethylene-bis(3,4-epoxycyclohexanecarboxylate), dioctyl epoxyhexahydrophthalate, di-2-ethylhexyl epoxyhexahydrophthalate, and the above-described Compound Nos. A2 to A4.

Examples of commercially available products that can be suitably used as an alicyclic epoxy resin include UVR-6100, UVR-6105, UVR-6110, UVR-6128 and UVR-6200 (all of which are manufactured by Union Carbide Corporation); CELLOXIDE 2021, CELLOXIDE 2021P, CELLOXIDE 2081, CELLOXIDE 2083, CELLOXIDE 2085, CELLOXIDE 2000, CELLOXIDE 3000, CYCLOMER A200, CYCLOMER M100, CYCLOMER M101, EPOLEAD GT-301, EPOLEAD GT-302, EPOLEAD 401, EPOLEAD 403, ETHB and EPOLEAD HD300 (all of which are manufactured by Daicel Chemical Industries, Ltd.); and KRM-2110 and KRM-2199 (both of which are manufactured by ADEKA Corporation).

Further, specific examples of aromatic epoxy resins include polyglycidyl ethers of polyhydric phenols having at least one aromatic ring or alkylene oxide adducts thereof, such as glycidyl ethers of an epoxy compound represented by the Formula (IV), bisphenol A, bisphenol F or an alkylene oxide adduct thereof; novolac-type epoxy compounds, such as phenol novolac-type epoxy compounds, biphenyl novolac-type epoxy compounds, cresol novolac-type epoxy compounds, bisphenol A novolac-type epoxy compounds and dicyclopentadiene novolac-type epoxy compounds; alicyclic epoxy compounds, such as 3,4-epoxy-6-methylcyclohexylmethyl-3,4-epoxy-6-methylcyclohexane carboxylate, 3,4-epoxycyclohexylmethyl-3,4-epoxycyclohexane carboxylate and 1-epoxyethyl-3,4-epoxycyclohexane; glycidyl esters, such as diglycidyl phthalate, diglycidyl tetrahydrophthalate and glycidyl dimerate; glycidylamines, such as tetraglycidyl diaminodiphenylmethane, triglycidyl p-aminophenol and N,N-diglycidylaniline; heterocyclic epoxy compounds, such as 1,3-diglycidyl-5,5-dimethylhydantoin and triglycidyl isocyanurate; dioxide compounds, such as dicyclopentadiene dioxide; naphthalene-type epoxy compounds; triphenylmethane-type epoxy compounds; dicyclopentadiene-type epoxy compounds; and monofunctional aromatic epoxy compounds, such as phenyl glycidyl ether, p-butylphenol glycidyl ether, cresyl glycidyl ether, 2-methylcresyl glycidyl ether, 4-nonylphenyl glycidyl ether, benzyl glycidyl ether, p-cumylphenyl glycidyl ether and trityl glycidyl ether.

Specific examples of aliphatic epoxy resins include polyglycidyl ethers of aliphatic polyhydric alcohols or alkylene oxide adducts thereof; polyglycidyl esters of aliphatic long-chain polybasic acids; homopolymers synthesized by vinyl polymerization of glycidyl acrylate or glycidyl methacrylate; and copolymers synthesized by vinyl polymerization of glycidyl acrylate or glycidyl methacrylate and other vinyl monomer(s). Representative examples of these compounds include glycidyl methacrylate, methyl glycidyl ether, ethyl glycidyl ether, propyl glycidyl ether, isopropyl glycidyl ether, butyl glycidyl ether, isobutyl glycidyl ether, t-butyl glycidyl ether, pentyl glycidyl ether, hexyl glycidyl ether, heptyl glycidyl ether, octyl glycidyl ether, nonyl glycidyl ether, decyl glycidyl ether, undecyl glycidyl ether, dodecyl glycidyl ether, tridecyl glycidyl ether, tetradecyl glycidyl ether, pentadecyl glycidyl ether, hexadecyl glycidyl ether, 2-ethylhexyl glycidyl ether, allyl glycidyl ether, propargyl glycidyl ether, p-methoxyethyl glycidyl ether, p-methoxy glycidyl ether, 2,3-epoxypropyl methacrylate, epoxidized linseed oil, glycidyl butyrate, vinylcyclohexane monoxide, 1,2-epoxy-4-vinylcyclohexane, styrene oxide, pinene oxide, methylstyrene oxide, cyclohexene oxide, propylene oxide, and the above-described Compound No. A1; glycidyl ethers of polyhydric alcohols, such as 1,4-butanediol diglycidyl ether, 1,6-hexanediol diglycidyl ether, 1,4-cyclohexane dimethanol diglycidyl ether, 1,1,1-tri(glycidyloxymethyl)propane, 1,1,1-tri(glycidyloxymethyl)ethane, 1,1,1-tri(glycidyloxymethyl)methane, 1,1,1-tetra(glycidyloxymethyl)methane, glycerol triglycidyl ether, trimethylolpropane triglycidyl ether, sorbitol tetraglycidyl ether, dipentaerythritol hexaglycidyl ether, polyethylene glycol diglycidyl ether and polypropylene glycol diglycidyl ether; polyglycidyl ethers of polyether polyols obtained by addition of one or more alkylene oxides to an aliphatic polyhydric alcohol, such as propylene glycol, trimethylolpropane or glycerin; and diglycidyl esters of aliphatic long-chain dibasic acids. Representative examples also include monoglycidyl ethers of aliphatic higher alcohols; monoglycidyl ethers of phenol, cresol, butylphenol, or polyether alcohols obtained by addition of an alkylene oxide thereto; glycidyl esters of higher fatty acids; epoxidized soybean oil; octyl epoxystearate; butyl epoxystearate; and epoxidized polybutadienes.

Examples of commercially available products that can be suitably used as an aromatic or aliphatic epoxy resin include EPIKOTE 801 and EPIKOTE 828 (both of which are manufactured by Yuka Shell Epoxy K.K.); PY-306, 0163, and DY-022 (all of which are manufactured by BASF Japan, Ltd.); KRM-2720, EP-4100, EP-4000, EP-4080, EP-4900, ED-505 and ED-506 (all of which are manufactured by ADEKA Corporation); EPOLIGHT M-1230, EPOLIGHT EHDG-L, EPOLIGHT 40E, EPOLIGHT 100E, EPOLIGHT 200E, EPOLIGHT 400E, EPOLIGHT 70P, EPOLIGHT 200P, EPOLIGHT 400P, EPOLIGHT 1500NP, EPOLIGHT 1600, EPOLIGHT 80MF, EPOLIGHT 100MF, EPOLIGHT 4000, EPOLIGHT 3002 and EPOLIGHT FR-1500 (all of which are manufactured by Kyoeisha Chemical Co., Ltd.); and SUNTOHTO ST0000, YD-716, YH-300, PG-202, PG-207, YD-172 and YDPN638 (all of which are manufactured by Tohto Kasei Co., Ltd.).

Further, specific examples of the oxetane compounds include the following compounds: 3-ethyl-3-hydroxymethyloxetane, 3-(meth)allyloxymethyl-3-ethyloxetane, (3-ethyl-3-oxetanylmethoxy)methylbenzene, 4-fluoro-[1-(3-ethyl-3-oxetanylmethoxy)methyl]benzene, 4-methoxy-[1-(3-ethyl-3-oxetanylmethoxy)methyl]benzene, [1-(3-ethyl-3-oxetanylmethoxy)ethyl]phenyl ether, isobutoxymethyl(3-ethyl-3-oxetanylmethyl)ether, isobornyloxyethyl(3-ethyl-3-oxetanylmethyl)ether, isobornyl(3-ethyl-3-oxetanylmethyl)ether, 2-ethylhexyl(3-ethyl-3-oxetanylmethyl)ether, ethyldiethylene glycol (3-ethyl-3-oxetanylmethyl)ether, dicyclopentadiene(3-ethyl-3-oxetanylmethyl)ether, dicyclopentenyloxyethyl(3-ethyl-3-oxetanylmethyl)ether, dicyclopentenyl(3-ethyl-3-oxetanylmethyl)ether, tetrahydrofurfuryl(3-ethyl-3-oxetanylmethyl)ether, tetrabromophenyl(3-ethyl-3-oxetanylmethyl)ether, 2-tetrabromophenoxyethyl(3-ethyl-3-oxetanylmethyl)ether, tribromophenyl(3-ethyl-3-oxetanylmethyl)ether, 2-tribromophenoxyethyl(3-ethyl-3-oxetanylmethyl)ether, 2-hydroxyethyl(3-ethyl-3-oxetanylmethyl)ether, 2-hydroxypropyl(3-ethyl-3-oxetanylmethyl)ether, butoxyethyl(3-ethyl-3-oxetanylmethyl)ether, pentachlorophenyl(3-ethyl-3-oxetanylmethyl)ether, pentabromophenyl(3-ethyl-3-oxetanylmethyl)ether, bornyl(3-ethyl-3-oxetanylmethyl) ether, 3,7-bis(3-oxetanyl)-5-oxa-nonane, 3,3'-(1,3-(2-methylenyl)propanediyl-bis(oxymethylene))bis-(3-ethyloxetane), 1,4-bis[(3-ethyl-3-oxetanylmethoxy)methyl] benzene, 1,2-bis[(3-ethyl-3-oxetanylmethoxy)methyl] ethane, 1,3-bis[(3-ethyl-3-oxetanylmethoxy)methyl] propane, ethylene glycol-bis(3-ethyl-3-oxetanylmethyl) ether, dicyclopentenyl-bis(3-ethyl-3-oxetanylmethyl)ether, triethylene glycol-bis(3-ethyl-3-oxetanylmethyl)ether, tetraethylene glycol-bis(3-ethyl-3-oxetanylmethyl)ether, tricyclodecane-diyldimethylene(3-ethyl-3-oxetanylmethyl)ether, trimethylolpropane tris(3-ethyl-3-oxetanylmethyl)ether, 1,4-bis(3-ethyl-3-oxetanylmethoxy)butane, 1,6-bis(3-ethyl-3-oxetanylmethoxy)hexane, pentaerythritol tris(3-ethyl-3-oxetanylmethyl)ether, pentaerythritol tetrakis(3-ethyl-3-oxetanylmethyl)ether, polyethylene glycol-bis(3-ethyl-3-oxetanylmethyl)ether, dipentaerythritol hexakis(3-ethyl-3-oxetanylmethyl)ether, dipentaerythritol pentakis(3-ethyl-3-oxetanylmethyl)ether, dipentaerythritol tetrakis(3-ethyl-3-oxetanylmethyl)ether, caprolactone-modified dipentaerythritol hexakis(3-ethyl-3-oxetanylmethyl)ether, caprolactone-modified dipentaerythritol pentakis(3-ethyl-3-oxetanylmethyl)ether, ditrimethylolpropane tetrakis(3-ethyl-3-oxetanylmethyl)ether, EO-modified bisphenol A-bis (3-ethyl-3-oxetanylmethyl)ether, PO-modified bisphenol A-bis(3-ethyl-3-oxetanylmethyl)ether, EO-modified hydrogenated bisphenol A-bis(3-ethyl-3-oxetanylmethyl)ether, PO-modified hydrogenated bisphenol A-bis(3-ethyl-3-oxetanylmethyl)ether, and EO-modified bisphenol F-(3-ethyl-3-oxetanylmethyl)ether.

The use of these oxetane compounds is effective and thus preferred particularly when flexibility is required.

Specific examples of other compounds used as the cationically polymerizable compound include cyclic lactone compounds, such as βl-propiolactone and ε-caprolactone; cyclic acetal compounds, such as trioxane, 1,3-dioxolane and 1,3,6-trioxanecyclooctane; cyclic thioether compounds, such as tetrahydrothiophene derivatives; spiro-orthoester compounds obtained by reaction between any of the above-described epoxy compounds and lactone; vinyl ether compounds, such as ethylene glycol divinyl ether, alkyl vinyl ether, 2-chloroethyl vinyl ether, 2-hydroxyethyl vinyl ether, triethylene glycol divinyl ether, 1,4-cyclohexanedimethanol divinyl ether, hydroxybutyl vinyl ether, and the propenyl ether of propylene glycol; vinyl compounds, such as ethylenically unsaturated compounds, including styrene, vinylcyclohexene, isobutylene and polybutadiene; oxolane compounds, such as tetrahydrofuran and 2,3-dimethyltetrahydrofuran; thiirane compounds, such as ethylene sulfide and thioepichlorohydrin; thietane compounds, such as 1,3-propyne sulfide and 3,3-dimethylthietane; and silicones, all of which compounds are well-known.

The cationic polymerization initiator may be any compound as long as it is activated by irradiation with light or heat, and examples thereof include onium salts, naphthalimide sulfonate compounds, oxime sulfonate compounds, sulfonylimide compounds and sulfonic acid esters, among which onium salts and naphthalimide sulfonate compounds are preferred. Depending on the condition of use, the cationic polymerization initiator acts as a thermal cationic polymerization initiator or a photocationic polymerization initiator.

Examples of the onium salts include cation-anion salts represented by $[M]^{r+}[G]^{r-}$. The cation $[M]^{r+}$ is preferably onium, and its structure can be represented by, for example, the following Formula: $[(R^{29})_fQ]^{r+}$.

$R^{29}$ is an organic group having 1 to 60 carbon atoms, which may contain any number of non-carbon atoms, and f is an integer of 1 to 5. $R^{29}$s existing in the number of f are each independently the same or different from one another, and at least one of $R^{29}$s is preferably an aromatic ring-containing organic group as described above. Q is an atom or an atomic group selected from the group consisting of S, N, Se, Te, P, As, Sb, Bi, O, I, Br, Cl, F, and N=N. Further, it is required that the relationship, r=f−q, wherein q is the valence of Q in the cation $[M]^{r+}$, be satisfied (with a proviso that the valence of N=N is 0).

Specific examples of the anion $[G]^{r-}$ include, as monovalent anions, halide anions such as a chloride ion, a bromide ion, an iodide ion, and a fluoride ion; inorganic anions, such as a perchlorate ion, a chlorate ion, a thiocyanate ion, a hexafluorophosphate ion, a hexafluoroantimonate ion and a tetrafluoroborate ion; borate anions, such as tetrakis(pentafluorophenyl)borate, tetra(3,5-difluoro-4-methoxyphenyl) borate, tetrafluoroborate, tetraarylborate and tetrakis(pentafluorophenyl)borate; organic sulfonate anions, such as a methanesulfonate ion, a dodecylsulfonate ion, a benzenesulfonate ion, a toluenesulfonate ion, a trifluoromethanesulfonate ion, a naphthalenesulfonate ion, a diphenylamine-4-sulfonate ion, a 2-amino-4-methyl-5-chlorobenzenesulfonate ion, a 2-amino-5-nitrobenzenesulfonate ion, a phthalocyaninesulfonate ion, a fluorosulfonate ion, a trinitrobenzenesulfonate anion, a camphor sulfonate ion, a nonafluorobutanesulfonate ion, a hexadecafluorooctanesulfonate ion, a polymerizable substituent-containing sulfonate ion, and sulfonate ions described in Japanese Unexamined Patent Application Publication No. H10-235999, Japanese Unexamined Patent Application Publication No. H10-337959, Japanese Unexamined Patent Application Publication No. H11-102088, Japanese Unexamined Patent Application Publication No. 2000-108510, Japanese Unexamined Patent Application Publication No. 2000-168223, Japanese Unexamined Patent Application Publication No. 2001-209969, Japanese Unexamined Patent Application Publication No. 2001-322354, Japanese Unexamined Patent Application Publication No. 2006-248180, Japanese Unexamined Patent Application Publication No. 2006-297907, Japanese Unexamined Patent Application Publication No. H8-253705, Japanese Unexamined Patent Application Publication (Translation of PCT Application) No. 2004-503379, Japanese Unexamined Patent Application Publication No. 2005-336150, WO 2006/28006 and the like; organic phosphate anions, such as an octyl phosphate ion, a dodecyl phosphate ion, an octadecyl phosphate ion, a phenyl phosphate ion, a nonylphenyl phosphate ion and a 2,2'-methylene-bis(4,6-di-t-butylphenyl)phosphonate ion; a bis-trifluoromethylsulfonylimide ion; a bis-perfluorobutanesulfonylimide ion; a perfluoro-4-ethylcyclohexanesulfonate ion; a tetrakis(pentafluorophenyl)borate ion; and a tris(fluoroalkylsulfonyl)carbo anion, and examples of divalent anion $[G]^{r-}$ include a benzenedisulfonate ion and a naphthalenedisulfonate ion.

In the present invention, among such onium salts, it is particularly effective to use an aromatic onium salt, such as an aryldiazonium salt, a diaryliodonium salt or a triarylsulfonium salt. Such an aromatic onium salt may be used individually, or in combination of two or more thereof.

Other preferred examples include iron-arene complexes, such as (η⁵-2,4-cyclopentadien-1-yl)[(1,2,3,4,5,6-η)-(1-methylethyl)benzene]-iron-hexafluorophosphate; and mixtures of an aluminum complex, such as tris(acetylacetonato) aluminum, tris(ethylacetonatoacetato)aluminum or tris (salicylaldehydato)aluminum, and a silanol such as triphenyl silanol.

Thereamong, it is preferred to use an aromatic sulfonium salt from the standpoint of its practicality and photosensitivity. As the aromatic sulfonium salt, a commercially available one can be used as well, and examples thereof include WPAG-336, WPAG-367, WPAG-370, WPAG-469 and WPAG-638 (all of which are manufactured by Wako Pure Chemical Industries, Ltd.); CPI-100P, CPI-101A, CPI-200K and CPI-210S (all of which are manufactured by San-Apro Ltd.); and ADEKA OPTOMER SP-056, ADEKA OPTOMER SP-066, ADEKA OPTOMER SP-130, ADEKA OPTOMER SP-140, ADEKA OPTOMER SP-082, ADEKA OPTOMER SP-103, ADEKA OPTOMER SP-601, ADEKA OPTOMER SP-606 and ADEKA OPTOMER SP-701 (all of which are manufactured by ADEKA Corporation).

As the naphthalimide sulfonate compounds, those compounds represented by the following Formula (II) are preferred because of their sensitivity.

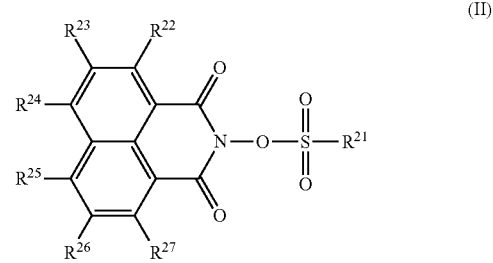

(II)

In the Formula (II), $R^{21}$ represents an aliphatic hydrocarbon group having 1 to 18 carbon atoms, an aryl group having 6 to 20 carbon atoms, an arylalkyl group having 7 to 20 carbon atoms, an acyl group-substituted aryl group having 7 to 20 carbon atoms, an alicyclic hydrocarbon group having 3 to 12 carbon atoms, or a 10-camphoryl group, which aliphatic hydrocarbon group, aryl group, arylalkyl group or alicyclic hydrocarbon group is unsubstituted or substituted with a group selected from a halogen atom, a halogenated alkyl group having 1 to 4 carbon atoms, an alkoxy group having 1 to 18 carbon atoms and an alkylthio group having 1 to 18 carbon atoms. $R^{22}$, $R^{23}$, $R^{24}$, $R^{25}$, $R^{26}$ and $R^{27}$ each represent a hydrogen atom, a halogen atom, a cyano group, a hydroxyl group, a nitro group, a carboxyl group, an alkyl group having 1 to 40 carbon atoms which is optionally substituted, an aryl group having 6 to 20 carbon atoms, an arylalkyl group having 7 to 20 carbon atoms, or a heterocycle-containing group having 2 to 20 carbon atoms.

As the oxime sulfonate compounds, those compounds represented by the following Formula (III) are preferred because of their sensitivity.

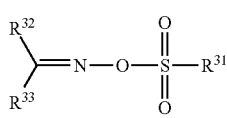

(III)

In the Formula (III), $R^{31}$ represents an aliphatic hydrocarbon group having 1 to 18 carbon atoms, an aryl group having 6 to 20 carbon atoms, an arylalkyl group having 7 to 20 carbon atoms, an acyl group-substituted aryl group having 7 to 20 carbon atoms, an alicyclic hydrocarbon group having 3 to 12 carbon atoms, or a 10-camphoryl group, which aliphatic hydrocarbon group, aryl group, arylalkyl group or alicyclic hydrocarbon group is unsubstituted or substituted with a group selected from a halogen atom, a halogenated alkyl group having 1 to 4 carbon atoms, an alkoxy group having 1 to 18 carbon atoms and an alkylthio group having 1 to 18 carbon atoms. $R^{32}$ and $R^{33}$ each represent a cyano group, a carboxyl group, an alkyl group having 1 to 40 carbon atoms which is optionally substituted, an aryl group having 6 to 20 carbon atoms, an arylalkyl group having 7 to 20 carbon atoms, or a heterocycle-containing group having 2 to 20 carbon atoms, and $R^{32}$ and $R^{33}$ are optionally bound with each other to form a 5-membered heterocycle.

Examples of a photoacid generator include compounds which generate an acid when irradiated with an active energy ray and, in addition to those compounds that are exemplified above as the cationic polymerization initiator, alkanesulfonic acids, arylsulfonic acids, partially or fully fluorinated arylsulfonic acids, partially or fully fluorinated alkanesulfonic acids, 2-nitrobenzyl esters, N-iminosulfonates, arylsulfonic acid esters, heterocyclic compounds having a halogen such as chlorine, diazonium salts and diazonaphthoquinone compounds which generate indene carboxylic acid, such as naphthoquinonediazide sulfonic acid esters formed by naphthoquinonediazide sulfonic acid and a polyhydric phenol, can be used as a photoacid generator.

Examples of the diazonaphthoquinone compounds include 2,3,4-trihydroxybenzophenone, 4-(4-[1,1-bis(4-hydroxyphenyl)ethyl]-α,α-dimethylbenzyl)phenol, and 6-diazo-5,6-dihydro-5-oxo-1-naphthalenesulfonic acid.

In the solvent-developable photosensitive resin composition which is a water-developable photosensitive composition containing water as the solvent, a photosensitive group-introduced water-soluble polymer can be used as the binder resin. Examples of the photosensitive group include a vinyl group, an allyl group, a styryl group, a cinnamyl group, a cinnamoyl group, a cinnamylidene group, a cinnamylideneacetyl group, a chalcone group, a coumarin group, an isocoumarin group, a 2,5-dimethoxystilbene group, a maleimide group, an α-phenylmaleimide group, a 2-pyrone group, an azide group, a thymine group, a quinone group, a maleimide group, a uracil group, a pyrimidine group, a stilbazolium group, a styrylpyridinium group, a styrylquinolium group, an epoxy group, an oxetane group, a vinyl ether group, an allyl ether group, an acetylacetone structure, and a β-diketone structure.

The alkali-soluble composition comprises an alkali-soluble binder resin and, as required, the above-described radical polymerizable compound and/or a solvent. As the alkali-soluble binder resin, a resin having a carboxyl group or a phenolic hydroxyl group in the resin side chain or main chain can be used, and examples thereof include acrylic acid (co)polymers; acrylate copolymers; phenol and/or cresol novolac epoxy resins; polyphenylmethane-type epoxy resins having a polyfunctional epoxy group; epoxy acrylate resins; resins that are obtained by allowing an unsaturated monobasic acid to act on an epoxy group of an epoxy compound, such as a compound represented by general Formula (IV) below, and then further allowing a polybasic acid anhydride to act on the resultant;

styrene-maleic anhydride resins; novolac epoxy acrylate resins modified with an acid anhydride; hydroxystyrene polymers and derivatives thereof; phenol resins; and phosphate polymers.

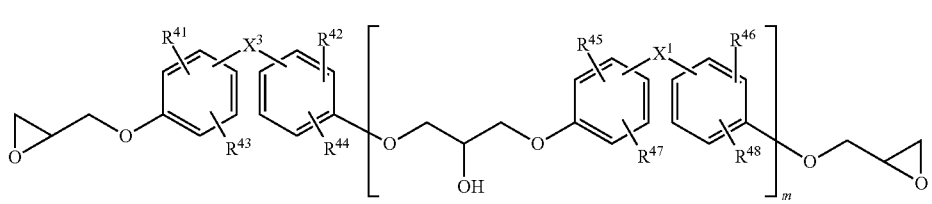

(IV)

In the Formula (IV), $X^3$ represents a direct bond, a methylene group, an alkylidene group having 1 to 4 carbon atoms, an alicyclic hydrocarbon group having 3 to 20 carbon atoms, O, S, $SO_2$, SS, SO, CO, OCO, or a group represented by the following Formula (a), (b) or (c), which alkylidene group is optionally substituted with a halogen atom; $R^{41}$, $R^{42}$, $R^{43}$, $R^{44}$, $R^{45}$, $R^{46}$, $R^{47}$ and $R^{48}$ each independently represent a hydrogen atom, an alkyl group having 1 to 5 carbon atoms, an alkoxy group having 1 to 8 carbon atoms, an alkenyl group having 2 to 5 carbon atoms, or a halogen atom, which alkyl group, alkoxy group and alkenyl group are optionally substituted with a halogen atom; m represents an integer of 0 to 10; and an optical isomer that exists when m is not 0 may be any isomer.

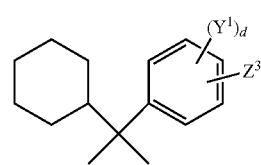

(a)

In the Formula (a), $Z^3$ represents a hydrogen atom, a phenyl group which is optionally substituted with an alkyl group having 1 to 10 carbon atoms or an alkoxy group having 1 to 10 carbon atoms, or a cycloalkyl group having 3 to 10 carbon atoms which is optionally substituted with an alkyl group having 1 to 10 carbon atoms or an alkoxy group having 1 to 10 carbon atoms; $Y^1$ represents an alkyl group having 1 to 10 carbon atoms, an alkoxy group having 1 to 10 carbon atoms, an alkenyl group having 2 to 10 carbon atoms, or a halogen atom, which alkyl group, alkoxy group and alkenyl group are optionally substituted with a halogen atom; and d represents an integer of 0 to 5.

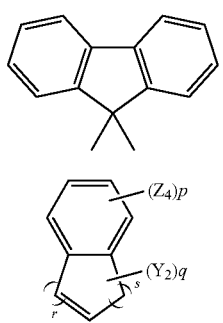

In the Formula (c), $Y^2$ and $Z^4$ each independently represent an alkyl group having 1 to 10 carbon atoms which is optionally substituted with a halogen atom, an aryl group having 6 to 20 carbon atoms which is optionally substituted with a halogen atom, an aryloxy group having 6 to 20 carbon atoms which is optionally substituted with a halogen atom, an arylthio group having 6 to 20 carbon atoms which is optionally substituted with a halogen atom, an arylalkenyl group having 6 to 20 carbon atoms which is optionally substituted with a halogen atom, an arylalkyl group having 7 to 20 carbon atoms which is optionally substituted with a halogen atom, a heterocyclic group having 2 to 20 carbon atoms which is optionally substituted with a halogen atom, or a halogen atom; the alkylene moieties of the alkyl group and arylalkyl group are optionally interrupted by an unsaturated bond, —O— or —S—; adjacent $Z^4$s are optionally bound with each other to form a ring; p represents an integer of 0 to 4; q represents an integer of 0 to 8; r represents an integer of 0 to 4; s represents an integer of 0 to 4; and the sum of r and s is an integer of 2 to 4.

Examples of the unsaturated monobasic acid that is allowed to act on an epoxy compound include acrylic acid, methacrylic acid, crotonic acid, cinnamic acid, sorbic acid, hydroxyethyl methacrylate-malate, hydroxyethyl acrylate-malate, hydroxypropyl methacrylate-malate, hydroxypropyl acrylate-malate, and dicyclopentadiene-malate.

Examples of the polybasic acid anhydride that is allowed to act after the unsaturated monobasic acid include biphenyltetracarboxylic acid dianhydride, tetrahydrophthalic anhydride, succinic anhydride, biphthalic anhydride, maleic anhydride, trimellitic anhydride, pyromellitic anhydride, 2,2',3,3'-benzophenonetetracarboxylic acid anhydride, ethylene glycol bis-anhydrotrimellitate, glycerol tris-anhydrotrimellitate, hexahydrophthalic anhydride, methyltetrahydrophthalic anhydride, nadic anhydride, methylnadic anhydride, trialkyltetrahydrophthalic anhydrides, hexahydrophthalic anhydride, 5-(2,5-dioxotetrahydrofuryl)-3-methyl-3-cyclohexene-1,2-dicarboxylic acid anhydride, trialkyltetrahydrophthalic anhydride-maleic anhydride adducts, dodecenylsuccinic anhydride, and methylhymic anhydride.

The reaction molar ratio of the epoxy compound, unsaturated monobasic acid and polybasic acid anhydride is preferably as follows. That is, it is preferred to set the ratio such that, in the resulting epoxy adduct having a structure in which 0.1 to 1.0 carboxyl group of the unsaturated monobasic acid is added per epoxy group of the epoxy compound, 0.1 to 1.0 acid anhydride structure of the polybasic acid anhydride is incorporated per hydroxyl group of the epoxy adduct. The reactions of the epoxy compound, unsaturated monobasic acid and polybasic acid anhydride can be carried out in accordance with a conventional method.

The alkali-developable photosensitive composition comprises the alkali-developable binder resin, the radical polymerizable compound, a photopolymerization initiator and, as required, a solvent.

For the purpose of adjusting the acid value and thereby improving the developability of the alkali-developable photosensitive resin composition of the present invention, the above-described cationically polymerizable compound can be further used in combination.

It is preferred that the alkali-developable binder resin have a solid content acid value in a range of 5 to 120 mgKOH/g. The amount of the cationically polymerizable compound to be used is preferably selected such that the above-described acid value is satisfied.

In the alkali-developable photosensitive composition, among the above-exemplified radical polymerizable compounds, one which contains an alkali-developable functional group (e.g., a hydroxy group or a carboxyl group) may be used along with a photopolymerizable initiator and, as required, a solvent, and a film can also be formed by allowing such an alkali-developable functional group-containing radical polymerizable compound to polymerize.

As the alkali-developable photosensitive composition, a high-molecular-weight polymer obtained by introducing a protecting group, which is decomposed by the action of an acid, into a resist base resin; a positive resist which contains a photoacid generator and, as required, a solvent and is solubilized in a developing solution by the action of an acid generated by exposure from the photoacid generator through a polarity change induced by deprotection reaction of a resist base resin; or a negative resist which contains a resin obtained by reaction between a resist base resin and a cross-linking agent, a photoacid generator and a solvent, undergoes a chemical chain reaction such as polymerization or cross-linking and is insolubilized in a developing solution by a cross-linking reaction of the resist base resin or a polarity change and from which only unexposed parts are selectively removed upon development, can also be used, and the alkali-developable photosensitive composition is particularly useful as a chemically amplified resist.

Examples of the resist base resin include polyhydroxystyrenes and derivatives thereof; polyacrylic acids and derivatives thereof; polymethacrylic acids and derivatives thereof; copolymers formed by two or more selected from hydroxystyrene, acrylic acid, methacrylic acid and derivatives thereof; copolymers formed by two or more selected from hydroxystyrene, styrene and derivatives thereof; copolymers formed by three or more selected from polyolefins and derivatives thereof, cycloolefins and derivatives thereof, maleic anhydride, and acrylic acid and derivatives thereof; copolymers formed by three or more selected from cycloolefins and derivatives thereof, maleimide, and acrylic acid and derivatives thereof; polynorbornenes; high-molecular-weight polymers of one or more selected from the group consisting of metathesis ring-opening polymers; and silicone resins.

The polystyrene-equivalent weight-average molecular weight (Mw) of the resist base resin, which is determined by gel permeation chromatography (GPC), is usually 1,000 to 500,000, preferably 2,000 to 200,000, more preferably 3,000 to 100,000. In this case, when the Mw of the resist base resin is less than 1,500, the heat resistance of the resulting film tends to be reduced, whereas when the Mw is higher than 300,000, the developability and coatability of the resulting film tends to be deteriorated.

Examples of the protecting group include ester groups, such as a methoxycarbonyl group, an ethoxycarbonyl group, an isopropyloxycarbonyl group, a phenoxycarbonyl group, an acetoxy group, a methoxyacetyloxy group, a propionyloxy group, a butyryloxy group, a t-butylcarbonyloxy group, a benzoyloxy group and an adamantylcarbonyloxy group; heteroalicyclic groups, such as tertiary alkyl groups, trialkylsilyl groups, oxoalkyl groups, aryl group-substituted alkyl groups and a tetrahydropyran-2-yl group; and acetal groups, such as tertiary alkylcarbonyl groups, tertiary alkylcarbonylalkyl groups, tertiary alkyloxycarbonyl groups, tertiary alkyloxycarbonylalkyl groups, alkoxyalkyl groups, a tetrahydropyranyl group, a tetrahydrofuranyl group and a thiofuranyl group.

The cross-linking agent can be arbitrarily selected from those compounds and resins that are commonly used as cross-linking agents, and examples thereof include bisazide compounds, and amino resins having a hydroxyl group or an alkoxyl group, such as melamine resins, urea resins, guanamine resins, glycoluril-formaldehyde resins, succinylamide-formaldehyde resins and ethylene urea-formaldehyde resins. As these cross-linking agents, melamine, urea, guanamine, glycoluril, succinylamide and ethylene urea that are each methylolated through reaction with formalin in boiling water, or further alkoxylated through reaction with a lower alcohol, can be used.

As the cross-linking agent, a commercially available one can be used as well, and examples thereof include NIKALAC MX-750, NIKALAC MW-30, and NIKALAC MX-290 (all of which are manufactured by Sanwa Chemical Co., Ltd.).

As the alkali-developable photosensitive composition, a composition which contains a resist base resin, a photoacid generator and, as required a solvent can also be used. In this case, it is preferred to use any of the above-described diazonium salts and diazonaphthoquinone compounds as the photoacid generator.

In the composition of the present invention, a colorant can further be incorporated. As the colorant, in addition to a color pigment, an inorganic or organic color material, or an inorganic or organic dye can be used. The term "pigment" used herein refers to a colorant insoluble in the below-described solvent and encompasses inorganic and organic color materials and dyes that are insoluble in the solvent, and laked inorganic and organic dyes.

Examples of the color pigment include carbon blacks, such as carbon blacks obtained by a furnace process, a channel process or a thermal process, acetylene black, Ketjen black, and lamp black; the above-described carbon blacks that have been adjusted or coated with an epoxy resin; the above-described carbon blacks that have been dispersed in a solvent together with a resin and thereby coated with 20 to 200 mg/g of the resin; the above-described carbon blacks that have been subjected to a surface treated with an acid or an alkali; carbon blacks having an average particle size of 8 nm or greater and a DBP oil absorption of 90 ml/100 g or less; carbon blacks having a total oxygen content, which is calculated from the CO and $CO_2$ content in the volatile component at 950° C., of not less than 9 mg per 100 $m^2$ of the surface area; graphite; graphitized carbon blacks; activated carbons; carbon fibers; carbon nanotubes; carbon microcoils; carbon nanohorns; carbon aerogels; fullerene; black pigments represented by aniline black, Pigment Black 7, titanium black, nigrosine and the like; and organic and inorganic pigments such as chromium oxide green, Milori blue, cobalt green, cobalt blue, manganese-based pigments, ferrocyanides, phosphate ultramarine blue, Prussian blue, ultramarine, cerulean blue, viridian, emerald green, lead sulfate, lead yellow, zinc yellow, Indian red (red iron (III) oxide), cadmium red, synthetic iron black, amber, and lake pigments.

Examples of the inorganic and organic color materials include nitroso compounds, nitro compounds, azo compounds, diazo compounds, xanthene compounds, quinoline compounds, anthraquinone compounds, coumarin compounds, cyanine compounds, phthalocyanine compounds, isoindolinone compounds, isoindoline compounds, quinacridone compounds, anthanthrone compounds, perinone compounds, perylene compounds, diketopyrrolopyrrole compounds, thioindigo compounds, dioxazine compounds, triphenylmethane compounds, quinophthalone compounds, naphthalene tetracarboxylic acid, nigrosine compounds, and metal complex compounds of azo dyes and cyanine dyes.

As the color pigment, a commercially available pigment can be used as well, and examples thereof include PIGMENT RED 1, 2, 3, 9, 10, 14, 17, 22, 23, 31, 38, 41, 48, 49, 88, 90, 97, 112, 119, 122, 123, 144, 149, 166, 168, 169, 170, 171, 177, 179, 180, 184, 185, 192, 200, 202, 209, 215, 216, 217, 220, 223, 224, 226, 227, 228, 240 and 254; PIGMENT ORANGE 13, 31, 34, 36, 38, 43, 46, 48, 49, 51, 52, 55, 59, 60, 61, 62, 64, 65 and 71; PIGMENT YELLOW 1, 3, 12, 13, 14, 16, 17, 20, 24, 55, 60, 73, 81, 83, 86, 93, 95, 97, 98, 100, 109, 110, 113, 114, 117, 120, 125, 126, 127, 129, 137, 138, 139, 147, 148, 150, 151, 152, 153, 154, 166, 168, 175, 180 and 185; PIGMENT GREEN 7, 10 and 36; PIGMENT BLUE 15, 15:1, 15:2, 15:3, 15:4, 15:5, 15:6, 22, 24, 56, 60, 61, 62 and 64; and PIGMENT VIOLET 1, 19, 23, 27, 29, 30, 32, 37, 40 and 50.

As the inorganic and organic color dyes, known dyes can also be used. Examples of the known dyes include azo dyes, anthraquinone dyes, indigoid dyes, triarylmethane dyes, xanthene dyes, alizarin dyes, acridine dyes, stilbene dyes, thiazole dyes, naphthol dyes, quinoline dyes, nitro dyes, indamine dyes, oxazine dyes, phthalocyanine dyes, cyanine dyes, and nigrosine dyes.

As for the method of the above-described exposure, the exposure is performed through a mask and, in the case of a resist film composed of a positive photosensitive composition, its solubility to a developing solution increases upon exposure and the exposed parts are thus removed, whereas in the case of a resist film composed of a negative photosensitive resin composition, its solubility to a developing solution decreases upon exposure and the exposed parts thus remain after development.

The exposure may be performed under the same conditions for all of the layers of the multilayer structure; however, the tapered shape can be designed freely by changing the width of the mask and/or the type of the active energy ray to be irradiated for each layer, by exposing the upper layer from the above and then exposing the lower layer from the transparent support side, or by performing the exposure from both sides. FIG. 1 provides cross-sectional views schematically showing examples of a pattern having a bilayer structure produced by the pattern-forming method of the present invention. FIG. 1A shows a pattern in which a first layer and a second layer are laminated on a substrate at substantially the same width; FIG. 1B shows a pattern in which the first layer and the second layer are laminated on the substrate in a tapered shape; and FIG. 1C shows a pattern in which the first layer and the second layer are laminated on the substrate in a reverse-tapered shape.

As the mask, for example, in addition to a photomask, a multi-tone mask such as a gray-tone mask or a half-tone mask, or a high-precision mask called "reticle" can be used.

As the active energy ray, an electromagnetic energy ray having a wavelength of 2,000 Å to 7,000 Å that is emitted from, for example, an ultrahigh-pressure mercury lamp, a high-pressure mercury lamp, a medium-pressure mercury lamp, a low-pressure mercury lamp, a mercury vapor arc lamp, a xenon arc lamp, a carbon arc lamp, a metal halide lamp, a fluorescent lamp, a tungsten lamp, an excimer lamp, an electrodeless light source, a sterilizing lamp, a light-emitting diode, a CRT light source, an LED, an excimer laser, a nitrogen laser, an argon ion laser, a helium-cadmium laser, a helium neon laser, a krypton ion laser, a semiconductor laser or a YAG laser; or a high-energy ray such as EUV, an electron beam, X-ray, radiation or a high-frequency wave can be utilized, and it is preferred to use an ultrahigh-pressure mercury lamp, a mercury vapor arc lamp, a carbon arc lamp, a xenon arc lamp or the like which emits a light having a wavelength of 300 to 450 nm. The active energy ray has an energy of 0.1 to 500,000 mJ/cm$^2$, preferably 5 to 50,000 mJ/cm$^2$, more preferably 10 to 20,000 mJ/cm$^2$.

When a laser light is used as an exposure light source, a laser direct imaging method of directly forming an image without using a mask based on digital information transmitted from a computer or the like can be employed. As the laser light, a light having a wavelength of 340 to 430 nm is suitably used; however, a light source which emits a light of the visible to infrared region, such as an excimer laser, a nitrogen laser, an argon ion laser, a helium-cadmium laser, a helium neon laser, a krypton ion laser, a semiconductor laser or a YAG laser, can also be used. When any of these lasers is used, a sensitizer that absorbs the light of the visible to infrared region is added.

For the development, a conventionally known method such as dip (immersion) development, spray development or puddle development is employed and, after the development, the resultant is washed with a special rinse or pure water and subsequently dried. The development is preferably performed at a room temperature to 80° C. for several seconds to 10 minutes. For the development, developing solutions most suitable for dissolving each composition constituting the multilayer structure are used.

As for the developing solutions, for example, the above-exemplified solvents can be used as neutral developing solutions; however, ketones, ether solvents, ester solvents, cellosolve solvents, BTX solvents, halogenated aromatic hydrocarbon solvents, and mixed solvents thereof are preferred. Thereamong, those solvents whose boiling point is 50 to 200° C. are preferred because such solvents do not remain as residual solvents after the development, and those solvents whose boiling point is 70 to 150° C. are more preferred.

Examples of an alkaline developing solution that can be used include organic developing solutions containing TMAH (tetramethylammonium hydroxide); and inorganic developing solutions containing a hydroxide, carbonate, silicate or phosphate of an alkali metal, which is represented by sodium hydroxide, potassium hydroxide, sodium carbonate, sodium silicate, potassium silicate, sodium metasilicate, sodium triphosphate or the like, and the concentration of the alkaline developing solution is 0.0001 to 10%.

The developing solution may also contain an organic amine, a surfactant and the like, in addition to water contained therein as a main component and a small amount of an organic solvent. A developing solution for negative working plates is usually an aqueous solution having a relatively low pH (7 to 11.5) which contains no inorganic strong alkaline component.

Next, a pattern obtained by the pattern-forming method of the present invention will be described. As the pattern, the thickness of the whole resist film is 0.1 to 1,000 μm, preferably 0.5 to 100 μm, more preferably 1 to 20 μm. The line width is 1 to 1,000 μm, preferably 3 to 500 μm, more preferably 5 to 100 μm. The spacing is 1 to 1,000 μm, preferably 3 to 500 μm, more preferably 5 to 100 μm.

When the pattern has a bilayer structure constituted by an upper layer and a lower layer, in accordance with the method of its use, the film thickness ratio of the upper layer and the lower layer can be arbitrarily set in a range of 0.1:99.9 to 99.9:0.1, and the film thickness ratio is preferably such a ratio that does not allow the developing solution for the upper layer to completely dissolve the lower layer.

Further, as long as the effects of the present invention are adversely affected, a variety of resin additives, such as a monomer, a photobase initiator, a cross-linking agent, a surfactant, an inorganic filler, an organic filler, a colorant (e.g., a pigment or a dye), an antifoaming agent, a thickening agent, a dispersant, a leveling agent, an organic metal coupling agent, a thixotropic agent, a carbon compound, metal fine particles, a metal oxide, a flame retardant, a plasticizer, a light stabilizer, a heat stabilizer, an anti-aging agent, elastomer particles, a chain transfer agent, a polymerization inhibitor, a UV absorber, an antioxidant, an antistatic agent, a mold release agent, a fluidity modifier, an adhesion promoter, an organic polymer and melamine, can be added as required.

Specific examples of the applications of a pattern obtained by the pattern-forming method of the present invention include printing plates, laminated boards, print substrates, dry films, circuits, interlayer insulating films, photo-spacers, black column spacers, color filters, solid-state image sensing devices, photovoltaic panels, touch panels, flat-panel displays, light-emitting diodes, organic light-emitting elements, liquid crystal display elements, semiconductor elements, photosensitive elements, luminescent films, fluorescent films, MEMS devices, 3D mounting elements, imprints, actuators, holograms, plasmon devices, printer heads, polarizing plates, polarizing films, optical waveguides, various printed articles, tablets, cosmetics, and dental material.

EXAMPLES

The present invention will now be described in more detail by way of examples thereof; however, the present invention is not restricted thereto. It is noted here that, in the below-described Examples and Comparative Examples, "part(s)" means "part(s) by mass".

[Production Example 1] Preparation of Alkali-Developable Photosensitive Composition No. 1

An alkali-developable photosensitive composition No. 1 was obtained by mixing 5.1 parts of ADEKA ARKLS WR-301 (alkali-developable binder resin, manufactured by ADEKA Corporation), 1.1 parts of KAYARAD DPHA (dipentaerythritol hexaacrylate, manufactured by Nippon Kayaku Co., Ltd.), 1.0 part of NCI-831 (radical polymerization initiator, manufactured by ADEKA Corporation), 3.5 parts of MA100 (carbon black, manufactured by Mitsubishi Chemical Corporation), 0.3 parts of KBM403 (alkoxysilane coupling agent, manufactured by Shin-Etsu Chemical Co., Ltd.) and 89 parts of PGMEA.

[Production Example 2] Preparation of Water-Developable Photosensitive Composition No. 2

A water-developable photosensitive composition No. 2 was obtained by heat-mixing 5 parts of stilbazolium-polyvinyl alcohol and 95 parts of ion-exchanged water.

[Production Example 3] Preparation of Water-Developable Photosensitive Composition No. 3

A water-developable photosensitive composition No. 3 was obtained by heat-mixing 4.8 parts of stilbazolium-polyvinyl alcohol, 0.2 parts of WATER BLACK R-510 (nigrosine-based dye, manufactured by Orient Chemical Industries Co., Ltd.) and 95 parts of ion-exchanged water.

[Production Example 4] Preparation of Alkali-Developable Photosensitive Composition No. 4

An alkali-developable photosensitive composition No. 4 was obtained by heat-mixing 49.8 parts of a resin having a structure in which 30% by mole of poly(p-hydroxystyrene) is substituted with t-butoxycarbonyl group (Mw=12,000), 0.1 parts of triphenylsulfonium nonafluorobutane-1-sulfonate, 0.1 parts of trifluoromethanesulfonic acid=1,3-dioxo-1H,3H-benzo[d,e]isoquinoline-2-yl ester (naphthalimide sulfonate compound) and 50 parts of PGMEA.

[Production Example 5] Preparation of Alkali-Developable Photosensitive Composition No. 5

An alkali-developable photosensitive composition No. 5 was obtained by mixing 12 parts of SPC-1000 (alkali-developable binder resin, manufactured by Showa Denko K.K.), 5.5 parts of M-402 (radical polymerizable compound, manufactured by Toagosei Co., Ltd.), 1.5 parts of IRGACURE OXE-02 (radical polymerization initiator, manufactured by BASF Japan Ltd.), 28 parts of C.I. PIGMENT GREEN 58 dispersion, 20 parts of C.I. PIGMENT YELLOW 150 dispersion, 1.5 parts of 2-mercaptobenzothiazole and 0.05 parts of MEGAFAC F-554 (surfactant, manufactured by DIC Corporation) and subsequently adding PGMEA such that the resultant had a solid content of 20%.

[Production Example 6] Preparation of Alkali-Developable Photosensitive Composition No. 6

An alkali-developable photosensitive composition No. 6 was obtained by mixing 5 parts of a novolac resin, 8 parts of o-naphthoquinonediazide-4-sulfonic acid ester, 2 parts of hexamethylenetetramine, 50 parts of ethyl lactate, 25 parts of N,N'-dimethylformamide, 4 parts of C.I. SOLVENT BLUE 25, 2 parts of C.I. SOLVENT YELLOW 82 and 2 parts of C.I. SOLVENT YELLOW 162.

[Production Example 7] Preparation of Organic Solvent-Developable Photosensitive Composition No. 7

A solvent-developable photosensitive composition No. 7 was obtained by mixing 80 parts of 3,4-epoxycyclohexyl-methyl-3,4-epoxycyclohexyl carboxylate, 18 parts of 1,4-butanediol diglycidyl ether and 2 parts of ADEKA OPTOMER SP-171 (photocationic polymerization initiator, manufactured by ADEKA Corporation).

[Production Example 8] Preparation of Organic Solvent-Developable Photosensitive Composition No. 8

A solvent-developable photosensitive composition No. 8 was obtained by mixing 20 parts of UA-306H pentaerythritol triacrylate hexamethylene diisocyanate urethane prepolymer (binder resin, manufactured by Kyoeisha Chemical Co., Ltd.), 80 parts of KAYARAD DPCA-60 (dipentaerythritol caprolactone-modified acrylate, manufactured by Nippon Kayaku Co., Ltd.) and 5 parts of IRGACURE 184 (photoradical polymerization initiator, manufactured by BASF Ltd.).

[Production Example 9] Preparation of Alkali-Developable Photosensitive Composition No. 9

An alkali-developable photosensitive composition No. 9 was obtained by mixing 5 parts of a novolac resin, 8 parts of o-naphthoquinonediazide-4-sulfonic acid ester and 50 parts of ethyl lactate.

[Production Example 10] Preparation of Water-Soluble Composition No. 10

A water-soluble composition No. 10 was obtained by heat-mixing 5 parts of KURARAY POVAL PVA203 (water-soluble polymer, manufactured by Kuraray Co., Ltd.) and 95 parts of ion-exchanged water.

[Production Example 11] Preparation of Water-Soluble Composition No. 11

A water-soluble composition No. 11 was obtained by heat-mixing 5 parts of KURARAY POVAL PVA103 (water-soluble polymer, manufactured by Kuraray Co., Ltd.) and 95 parts of ion-exchanged water.

[Production Example 12] Preparation of Water-Soluble Composition No. 12

A water-soluble composition No. 12 was obtained by heat-mixing 10 parts of NICHIGO G-POLYMER OKS-1083 (butenediol-vinyl alcohol copolymer, manufactured by The Nippon Synthetic Chemical Industry Co., Ltd.) and 95 parts of ion-exchanged water.

[Production Example 13] Preparation of Water-Soluble Composition No. 13

A water-soluble composition No. 13 was obtained by heat-mixing 10 parts of GOHSENX Z-200 (PVA having an acetylacetone structure, manufactured by The Nippon Synthetic Chemical Industry Co., Ltd.) and 90 parts of ion-exchanged water.

[Production Example 14] Preparation of Water-Soluble Composition No. 14

A water-soluble composition No. 14 was obtained by heat-mixing 9 parts of GOHSENX Z-200, 5 parts of BON- JET BLACK CW-1 (self-dispersible carbon black, manufactured by Orient Chemical Industries Co., Ltd.; 20% aqueous solution) and 86 parts of ion-exchanged water.

[Production Example 15] Preparation of Organic Solvent-Soluble Composition No. 15

An organic solvent-soluble composition No. 15 was obtained by mixing 10 parts of SUMIPEX LG (acrylic binder resin, manufactured by Sumitomo Chemical Co., Ltd.) and 90 parts of 2-butanone.

[Production Example 16] Preparation of Organic Solvent-Soluble Composition No. 16

An organic solvent-soluble composition No. 16 was obtained by mixing 9.5 parts of SUMIPEX LG, 0.5 parts of ethyl-2-cyano-3-(4-diethylamino)phenyl)acrylate, 18 parts of 2-butanone and 72 parts of cyclohexanone.

[Production Example 17] Preparation of Water-Soluble Composition No. 17

A water-soluble composition No. 17 was obtained by mixing 5 parts of K-90 (polyvinylpyrrolidone, manufactured by Nippon Shokubai Co., Ltd.) and 95 parts of ion-exchanged water.

[Production Example 18] Preparation of Water-Soluble Composition No. 18

A water-soluble composition No. 18 was obtained by mixing 5 parts of GE191-053 (polyvinylacetamide, manufactured by Showa Denko K.K.) and 95 parts of ion-exchanged water.

[Production Example 19] Preparation of Water-Soluble Composition No. 19

A water-soluble composition No. 19 was obtained by mixing 5 parts of polyacrylamide (manufactured by Tokyo Chemical Industry Co., Ltd.) and 95 parts of ion-exchanged water.

[Production Example 20] Preparation of Water-Soluble Composition No. 20

A water-soluble composition No. 20 was obtained by mixing 5 parts of AQ NYLON A-90 (water-soluble polymer, manufactured by Toray Industries, Inc.) and 95 parts of ion-exchanged water.

[Production Example 21] Preparation of Water-Soluble Composition No. 21

A water-soluble composition No. 21 was obtained by heat-mixing 10 parts of GOHSENX Z-300 (PVA having an acetylacetone structure, manufactured by The Nippon Synthetic Chemical Industry Co., Ltd.) and 90 parts of ion-exchanged water.

[Production Example 22] Preparation of Water-Soluble Composition No. 22

A water-soluble composition No. 22 was obtained by mixing 900 parts of the water-soluble composition No. 21, 50 parts of PESRESIN A-690 (carboxyl group-containing polyester, manufactured by Takamatsu Oil & Fat Co., Ltd.; solid content: 20%) and 4 parts of EPOCROS WS-700 (oxazoline compound, manufactured by Nippon Shokubai Co., Ltd.; solid content: 25%).

[Production Example 23] Preparation of Water-Soluble Composition No. 23

A water-soluble composition No. 23 was obtained by mixing 900 parts of the water-soluble composition No. 21, 50 parts of PESRESIN A-690 (carboxyl group-containing polyester, manufactured by Takamatsu Oil & Fat Co., Ltd.; solid content: 20%), 4 parts of EPOCROS WS-700 (oxazoline compound, manufactured by Nippon Shokubai Co., Ltd.; solid content: 25%) and 1 part of ORGATIX ZC-126 (zirconyl chloride compound, manufactured by Matsumoto Fine Chemical Co., Ltd.; solid content: 30%).

[Production Example 24] Preparation of Water-Soluble Composition No. 24

A water-soluble composition No. 24 was obtained by mixing 900 parts of the water-soluble composition No. 21, 50 parts of PESRESIN A-690 (carboxyl group-containing polyester, manufactured by Takamatsu Oil & Fat Co., Ltd.; solid content: 20%), 4 parts of EPOCROS WS-700 (oxazoline compound, manufactured by Nippon Shokubai Co., Ltd.; solid content: 25%) and 2.5 parts of CARBODILITE V-02-L2 (carbodiimide compound, manufactured by Nisshinbo Chemical Inc.; solid content: 40%).

[Production Example 25] Preparation of Water-Soluble Composition No. 25

A water-soluble composition No. 25 was obtained by mixing 900 parts of the water-soluble composition No. 21, 50 parts of PESRESIN A-690 (carboxyl group-containing polyester, manufactured by Takamatsu Oil & Fat Co., Ltd.; solid content: 20%), 4 parts of EPOCROS WS-700 (oxazoline compound, manufactured by Nippon Shokubai Co., Ltd.; solid content: 25%), 2.5 parts of CARBODILITE V-02-L2 (carbodiimide compound, manufactured by Nisshinbo Chemical Inc.; solid content: 40%) and 0.33 parts of ORGATIX ZC-126 (zirconyl chloride compound, manufactured by Matsumoto Fine Chemical Co., Ltd.; solid content: 30%).

[Production Example 26] Preparation of Water-Soluble Composition No. 26

A water-soluble composition No. 26 was obtained by heat-mixing 10 parts of GOHSENX T-330H (carboxyl group-containing PVA, manufactured by The Nippon Synthetic Chemical Industry Co., Ltd.) and 90 parts of ion-exchanged water.

[Production Example 27] Preparation of Water-Soluble Composition No. 27

A water-soluble composition No. 27 was obtained by mixing 630 parts of the water-soluble composition No. 21, 270 parts of the water-soluble composition No. 26, 50 parts of PESRESIN A-690 (carboxyl group-containing polyester, manufactured by Takamatsu Oil & Fat Co., Ltd.; solid content: 20%) and 4 parts of EPOCROS WS-700 (oxazoline compound, manufactured by Nippon Shokubai Co., Ltd.; solid content: 25%).

[Production Example 28] Preparation of Water-Soluble Composition No. 28

A water-soluble composition No. 28 was obtained by heat-mixing 10 parts of GOHSENX Z-200 (PVA having an acetylacetone structure, manufactured by The Nippon Synthetic Chemical Industry Co., Ltd.) and 90 parts of ion-exchanged water.

[Production Example 29] Preparation of Water-Soluble Composition No. 29

A water-soluble composition No. 29 was obtained by mixing 900 parts of the water-soluble composition No. 28, 33 parts of PESRESIN A-230 (carboxyl group-containing polyester, manufactured by Takamatsu Oil & Fat Co., Ltd.; solid content: 30%) and 4 parts of EPOCROS WS-700 (oxazoline compound, manufactured by Nippon Shokubai Co., Ltd.; solid content: 25%).

[Production Example 30] Preparation of Water-Soluble Composition No. 30

A water-soluble composition No. 30 was obtained by mixing 900 parts of the water-soluble composition No. 28, 33 parts of PESRESIN A-230 (carboxyl group-containing polyester, manufactured by Takamatsu Oil & Fat Co., Ltd.; solid content: 30%), 4 parts of EPOCROS WS-700 (oxazoline compound, manufactured by Nippon Shokubai Co., Ltd.; solid content: 25%) and 1 part of ORGATIX ZC-126 (zirconyl chloride compound, manufactured by Matsumoto Fine Chemical Co., Ltd.; solid content: 30%).

[Examples 1 to 166 and Comparative Examples 1 to 15] Pattern Formation

In accordance with the respective combinations shown in Tables 1 to 6, a lower layer was coated on a glass substrate or a lower layer film using a spin coater and subsequently dried. After coating an upper layer, the resultant was pre-baked on a 100° C. hot plate for 10 minutes to form a film. Then, the resultant was cooled to room temperature and, using a high-pressure mercury lamp, the thus formed film was irradiated with a light containing a wavelength of 365 nm through a photomask (line/space=100 µm/100 µm) at 3,200 mJ/cm$^2$. Subsequently, using each developing solution shown in Table 7, the upper layer and the lower layer were sequentially developed at 23° C. in the order mentioned. Thereafter, the substrate was dried in a 120° C. oven for 10 minutes, whereby a pattern was obtained.

TABLE 1

| | | Lower layer | | | | |
|---|---|---|---|---|---|---|
| | | No. 1 | No. 2 | No. 3 | No. 4 | No. 5 |
| Upper layer | No. 1 | — | Example 1 | Example 2 | Comparative Example 1 | — |
| | No. 2 | Example 15 | — | — | Example 16 | Example 17 |
| | No. 3 | Example 24 | — | — | Example 25 | Example 26 |
| | No. 4 | — | Example 33 | Example 34 | — | — |
| | No. 5 | Comparative Example 8 | Example 47 | Example 48 | — | — |
| | No. 6 | — | Example 61 | Example 62 | — | — |
| | No. 7 | — | Example 75 | Example 76 | — | — |
| | No. 8 | Example 89 | Example 90 | Example 91 | Example 92 | Example 93 |
| | No. 9 | — | Example 106 | Example 107 | — | — |
| | No. 10 | — | — | — | — | — |
| | No. 11 | Comparative Example 10 | — | — | — | — |
| | No. 12 | — | Comparative Example 11 | — | — | — |
| | No. 13 | — | — | — | — | — |
| | No. 14 | — | — | Comparative Example 12 | — | — |
| | No. 15 | — | — | — | — | — |
| | No. 16 | — | — | — | — | — |
| | No. 17 | — | — | — | — | — |
| | No. 18 | — | — | — | — | — |
| | No. 19 | — | — | — | — | — |
| | No. 20 | — | — | — | — | — |

TABLE 2

| | | Lower layer | | | | |
|---|---|---|---|---|---|---|
| | | No. 6 | No. 7 | No. 8 | No. 9 | No. 10 |
| Upper layer | No. 1 | — | Example 84 | Example 3 | — | Example 4 |
| | No. 2 | Example 18 | Example 19 | Example 20 | Example 21 | Comparative Example 2 |
| | No. 3 | Example 27 | Example 28 | Example 29 | Example 30 | — |
| | No. 4 | — | Example 77 | Example 35 | — | Example 36. |
| | No. 5 | — | Example 83 | Example 49 | — | Example 50 |
| | No. 6 | — | Example 95 | Example 63 | — | Example 64 |
| | No. 7 | — | — | Comparative Example 7 | — | Example 78 |

TABLE 2-continued

|  | | Lower layer | | | | |
|---|---|---|---|---|---|---|
|  | | No. 6 | No. 7 | No. 8 | No. 9 | No. 10 |
| | No. 8 | Example 94 | Comparative Example 9 | — | Example 96 | Example 97 |
| | No. 9 | — | Example 120 | Example 108 | — | Example 109 |
| | No. 10 | — | — | — | — | — |
| | No. 11 | — | — | — | — | — |
| | No. 12 | — | — | — | — | — |
| | No. 13 | — | — | — | — | — |
| | No. 14 | — | — | — | — | — |
| | No. 15 | Comparative Example 13 | — | — | — | — |
| | No. 16 | — | — | — | — | — |
| | No. 17 | — | — | — | — | — |
| | No. 18 | — | — | — | — | — |
| | No. 19 | — | — | — | — | — |
| | No. 20 | — | — | — | — | — |

TABLE 3

|  | | Lower layer | | | | |
|---|---|---|---|---|---|---|
|  | | No. 11 | No. 12 | No. 13 | No. 14 | No. 15 |
| Upper layer | No. 1 | Example 5 | Example 6 | Example 7 | Example 8 | Example 9 |
| | No. 2 | Comparative Example 3 | Comparative Example 4 | Comparative Example 5 | Comparative Example 6 | Example 22 |
| | No. 3 | — | — | — | — | Example 31 |
| | No. 4 | Example 37 | Example 38 | Example 39 | Example 40 | Example 41 |
| | No. 5 | Example 51 | Example 52 | Example 53 | Example 54 | Example 55 |
| | No. 6 | Example 65 | Example 66 | Example 67 | Example 68 | Example 69 |
| | No. 7 | Example 79 | Example 80 | Example 81 | Example 82 | — |
| | No. 8 | Example 98 | Example 99 | Example 100 | Example 101 | — |
| | No. 9 | Example 110 | Example 111 | Example 112 | Example 113 | Example 114 |
| | No. 10 | — | — | — | — | — |
| | No. 11 | — | — | — | — | — |
| | No. 12 | — | — | — | — | — |
| | No. 13 | — | — | — | — | — |
| | No. 14 | — | — | — | — | — |
| | No. 15 | — | — | — | — | — |
| | No. 16 | — | — | — | — | Comparative Example 14 |
| | No. 17 | — | — | — | — | — |
| | No. 18 | — | — | — | — | — |
| | No. 19 | — | — | — | — | — |
| | No. 20 | — | — | — | — | — |

TABLE 4

|  | | Lower layer | | | | |
|---|---|---|---|---|---|---|
|  | | No. 16 | No. 17 | No. 18 | No. 19 | No. 20 |
| Upper layer | No. 1 | Example 10 | Example 11 | Example 12 | Example 13 | Example 14 |
| | No. 2 | Example 23 | — | — | — | — |
| | No. 3 | Example 32 | — | — | — | — |
| | No. 4 | Example 42 | Example 43 | Example 44 | Example 45 | Example 46 |
| | No. 5 | Example 56 | Example 57 | Example 58 | Example 59 | Example 60 |
| | No. 6 | Example 70 | Example 71 | Example 72 | Example 73 | Example 74 |
| | No. 7 | — | Example 85 | Example 86 | Example 87 | Example 88 |
| | No. 8 | — | Example 102 | Example 103 | Example 104 | Example 105 |
| | No. 9 | Example 115 | Example 116 | Example 117 | Example 118 | Example 119 |
| | No. 10 | — | — | — | — | — |
| | No. 11 | — | — | — | — | — |
| | No. 12 | — | — | — | — | — |
| | No. 13 | — | — | — | — | — |
| | No. 14 | — | — | — | — | — |
| | No. 15 | — | — | — | — | — |
| | No. 16 | — | — | — | — | — |

TABLE 4-continued

|  | | Lower layer | | | | |
|---|---|---|---|---|---|---|
|  | | No. 16 | No. 17 | No. 18 | No. 19 | No. 20 |
|  | No. 17 | Comparative Example 15 | — | — | — | — |
|  | No. 18 | — | — | — | — | — |
|  | No. 19 | — | — | — | — | — |
|  | No. 20 | — | — | — | — | — |

TABLE 5

|  | | Lower layer | | | | |
|---|---|---|---|---|---|---|
|  | | No 21 | No. 22 | No. 23 | No. 24 | No. 25 |
| Upper layer | No. 1 | Example 120 | Example 121 | Example 122 | Example 123 | Example 124 |
|  | No. 2 | Example 130 | Example 131 | Example 132 | Example 133 | Example 134 |
|  | No. 3 | Example 137 | Example 138 | Example 139 | Example 140 | Example 141 |
|  | No. 4 | Example 147 | — | — | — | — |
|  | No. 5 | Example 150 | — | Example 151 | — | — |
|  | No. 6 | Example 154 | — | — | — | — |
|  | No. 7 | — | — | Example 157 | — | — |
|  | No. 8 | Example 160 | — | Example 161 | — | — |
|  | No. 9 | — | — | Example 164 | — | — |
|  | No. 10 | — | — | — | — | — |
|  | No. 11 | — | — | — | — | — |
|  | No. 12 | — | — | — | — | — |
|  | No. 13 | — | — | — | — | — |
|  | No. 14 | — | — | — | — | — |
|  | No. 15 | — | — | — | — | — |
|  | No. 16 | — | — | — | — | — |
|  | No. 17 | — | — | — | — | — |
|  | No. 18 | — | — | — | — | — |
|  | No. 19 | — | — | — | — | — |
|  | No. 20 | — | — | — | — | — |

TABLE 6

|  | | Lower layer | | | | |
|---|---|---|---|---|---|---|
|  | | No. 26 | No. 27 | No. 28 | No. 29 | No. 30 |
| Upper layer | No. 1 | Example 125 | Example 126 | Example 127 | Example 128 | Example 129 |
|  | No. 2 | — | — | — | Example 135 | Example 136 |
|  | No. 3 | Example 142 | Example 143 | Example 144 | Example 145 | Example 146 |
|  | No. 4 | — | — | — | Example 148 | Example 149 |
|  | No. 5 | — | — | — | Example 152 | Example 153 |
|  | No. 6 | — | — | — | Example 155 | Example 156 |
|  | No. 7 | — | — | — | Example 158 | Example 159 |
|  | No. 8 | — | — | — | Example 162 | Example 163 |
|  | No. 9 | — | — | — | Example 165 | Example 166 |
|  | No. 10 | — | — | — | — | — |
|  | No. 11 | — | — | — | — | — |
|  | No. 12 | — | — | — | — | — |
|  | No. 13 | — | — | — | — | — |
|  | No. 14 | — | — | — | — | — |
|  | No. 15 | — | — | — | — | — |
|  | No. 16 | — | — | — | — | — |
|  | No. 17 | — | — | — | — | — |
|  | No. 18 | — | — | — | — | — |
|  | No. 19 | — | — | — | — | — |
|  | No. 20 | — | — | — | — | — |

TABLE 7

| Composition | No. 1 | No. 2 | No. 3 | No. 4 | No. 5 | No. 6 | No. 7 | No. 8 | No. 9 | No. 10 |
|---|---|---|---|---|---|---|---|---|---|---|
| Developing solution | A | B | B | A | A | A | C | C | A | B |
| Composition | No. 11 | No. 12 | No. 13 | No. 14 | No. 15 | No. 16 | No. 17 | No. 18 | No. 19 | No. 20 |
| Developing solution | B | B | B | B | C | C | B | B | B | B |

A: 0.04% aqueous sodium hydroxide solution
B: ion-exchanged water
C: organic solvent (2-butanone)

The patterns obtained in Examples 1 to 166 were evaluated as follows. The evaluation results of the lamination properties are shown in Tables 8 to 13; the evaluation results of the photolithographic properties are shown in Tables 14 to 19; and the evaluation results of the solvent resistance are shown in Tables 20 to 25.

The laminated film thickness was evaluated only for the patterns of Examples 4 to 22, and the adhesion and gas barrier properties were evaluated only for the pattern of Example 99 and, as a reference, the pattern obtained by performing the film formation, exposure and development using the solvent-developable photosensitive composition No. 8.

(Lamination Properties)

The lamination properties in the sequential formation of the lower and upper layers were evaluated. The evaluation criteria were as follows.

○: The upper layer was formed with no disturbance in the lower layer.

Δ: Cloudiness and/or partial mixing occurred.

x: Application of the composition of the upper layer did not result in the formation of a laminated film due to disturbance on the film surface, dissolution of the lower layer or the like.

(Photolithographic Properties)

After the development and drying, the resulting pattern was observed under a laser microscope. The evaluation criteria were as follows.

○: The pattern had a resolution of 100±5 μm.

Δ: The pattern had a resolution of 100±10 μm.

x: The pattern had a resolution of 100±10 μm or larger, or the pattern disappeared.

(Solvent Resistance)

After the development and drying, the resulting pattern was immersed for 5 minutes in N-methylpyrrolidone (NMP) at 23° C., and the solvent was subsequently removed from the upper surface with nitrogen gas. The solvent resistance was evaluated by observing the state of the film surface before and after the test. The evaluation criteria were as follows.

○: No change was observed on the film surface.

Δ: Partial swelling and/or dissolution was observed.

x: The entire surface was changed due to swelling and/or dissolution.

(Laminated Film Thickness)

Ion-exchanged water was added to the water-soluble composition No. 10 to prepare a 2%-by-mass aqueous solution. Using the thus obtained aqueous solution, a lower layer of 0.1 μm in film thickness was formed. Subsequently, an upper layer of 10 μm in film thickness was formed using the alkali-developable photosensitive composition No. 1. Meanwhile, a lower layer of 10 μm in film thickness was formed using the water-soluble composition No. 10, and an upper layer of 10 μm in film thickness was formed thereon using the alkali-developable photosensitive composition No. 1. For both of the resulting laminates, a good pattern shape was obtained by developing the upper layer and the lower layer with a developing solution A and a developing solution B, respectively.

A 1%-by-mass solution was prepared by adding 2-butanone to the formulation of the organic solvent-soluble composition No. 15. Using the thus obtained solution, a lower layer of 0.1 μm in film thickness was formed. Subsequently, an upper layer of 10 μm in film thickness was formed using the water-developable photosensitive composition No. 2. Meanwhile, a lower layer of 10 μm in film thickness was formed using the organic solvent-soluble composition No. 15, and an upper layer of 10 μm in film thickness was then formed using the alkali-developable photosensitive composition No. 1. For both of the resulting laminates, a good pattern shape was obtained by developing the upper layer and the lower layer with the developing solution B and a developing solution C, respectively.

(Adhesion)

For the pattern obtained in Example 99 and the pattern obtained using the solvent-developable photosensitive composition No. 8, the adhesion was evaluated in accordance with JIS K5600-5-6 (Adhesion Test (Cross-cut Test)). The pattern of Example 99 showed no peeling or the like (Class 0); however, the majority of the pattern obtained using the solvent-developable photosensitive composition No. 8 was peeled off (Class 4).

(Gas Barrier Properties)

For the pattern obtained in Example 99 and the pattern obtained using the solvent-developable photosensitive composition No. 8, the oxygen permeability was measured with a 50-cm$^2$ folder using an oxygen permeation analyzer 8001 (manufactured by Illinois Instruments, Inc.). The pattern of Example 99 had an oxygen permeability of less than 0.01 cc/m$^2$/day, and the pattern of the solvent-developable photosensitive composition No. 8 had an oxygen permeability of 150 cc/m$^2$/day.

TABLE 8

| | | Lower layer | | | | |
|---|---|---|---|---|---|---|
| | | No. 1 | No. 2 | No. 3 | No. 4 | No. 5 |
| Upper layer | No. 1 | — | ○ | ○ | x | — |
| | No. 2 | ○ | — | — | ○ | ○ |
| | No. 3 | ○ | — | — | ○ | ○ |
| | No. 4 | — | ○ | ○ | — | — |
| | No. 5 | Δ | ○ | ○ | — | — |
| | No. 6 | — | ○ | ○ | — | — |
| | No. 7 | — | ○ | ○ | — | — |
| | No. 8 | ○ | ○ | ○ | ○ | ○ |
| | No. 9 | — | ○ | ○ | — | — |

TABLE 8-continued

| | | Lower layer | | | | |
|---|---|---|---|---|---|---|
| | | No. 1 | No. 2 | No. 3 | No. 4 | No. 5 |
| | No. 10 | — | — | — | — | — |
| | No. 11 | ○ | — | — | — | — |
| | No. 12 | — | x | — | — | — |
| | No. 13 | — | — | — | — | — |
| | No. 14 | — | — | x | — | — |
| | No. 15 | — | — | — | — | — |
| | No. 16 | — | — | — | — | — |
| | No. 17 | — | — | — | — | — |
| | No. 18 | — | — | — | — | — |
| | No. 19 | — | — | — | — | — |
| | No. 20 | — | — | — | — | — |

TABLE 9

| | | Lower layer | | | | |
|---|---|---|---|---|---|---|
| | | No. 6 | No. 7 | No. 8 | No. 9 | No. 10 |
| Upper layer | No. 1 | — | ○ | Δ | — | ○ |
| | No. 2 | ○ | ○ | ○ | ○ | x |
| | No. 3 | ○ | ○ | ○ | ○ | — |
| | No. 4 | — | ○ | Δ | — | ○ |
| | No. 5 | — | ○ | Δ | — | ○ |
| | No. 6 | — | ○ | Δ | — | ○ |
| | No. 7 | — | — | Δ | — | ○ |
| | No. 8 | ○ | Δ | — | ○ | ○ |
| | No. 9 | — | ○ | Δ | — | ○ |
| | No. 10 | — | — | — | — | — |
| | No. 11 | — | — | — | — | — |
| | No. 12 | — | — | — | — | — |
| | No. 13 | — | — | — | — | — |
| | No. 14 | — | — | — | — | — |
| | No. 15 | ○ | — | — | — | — |
| | No. 16 | — | — | — | — | — |
| | No. 17 | — | — | — | — | — |
| | No. 18 | — | — | — | — | — |
| | No. 19 | — | — | — | — | — |
| | No. 20 | — | — | — | — | — |

TABLE 10

| | | Lower layer | | | | |
|---|---|---|---|---|---|---|
| | | No. 11 | No. 12 | No. 13 | No. 14 | No. 15 |
| Upper layer | No. 1 | ○ | ○ | ○ | ○ | Δ |
| | No. 2 | x | x | x | x | ○ |
| | No. 3 | — | — | — | — | ○ |
| | No. 4 | ○ | ○ | ○ | ○ | Δ |
| | No. 5 | ○ | ○ | ○ | ○ | Δ |
| | No. 6 | ○ | ○ | ○ | ○ | Δ |
| | No. 7 | ○ | ○ | ○ | ○ | — |
| | No. 8 | ○ | ○ | ○ | ○ | — |
| | No. 9 | ○ | ○ | ○ | ○ | Δ |
| | No. 10 | — | — | — | — | — |
| | No. 11 | — | — | — | — | — |
| | No. 12 | — | — | — | — | — |
| | No. 13 | — | — | — | — | — |
| | No. 14 | — | — | — | — | — |
| | No. 15 | — | — | — | — | — |
| | No. 16 | — | — | — | — | x |
| | No. 17 | — | — | — | — | — |
| | No. 18 | — | — | — | — | — |
| | No. 19 | — | — | — | — | — |
| | No. 20 | — | — | — | — | — |

TABLE 11

| | | Lower layer | | | | |
|---|---|---|---|---|---|---|
| | | No. 16 | No. 17 | No. 18 | No. 19 | No. 20 |
| Upper layer | No. 1 | Δ | ○ | ○ | ○ | ○ |
| | No. 2 | ○ | — | — | — | — |
| | No. 3 | ○ | — | — | — | — |
| | No. 4 | Δ | ○ | ○ | ○ | ○ |
| | No. 5 | Δ | ○ | ○ | ○ | ○ |
| | No. 6 | Δ | ○ | ○ | ○ | ○ |
| | No. 7 | — | ○ | ○ | ○ | ○ |
| | No. 8 | — | ○ | ○ | ○ | ○ |
| | No. 9 | Δ | ○ | ○ | ○ | ○ |
| | No. 10 | — | — | — | — | — |
| | No. 11 | — | — | — | — | — |
| | No. 12 | — | — | — | — | — |
| | No. 13 | — | — | — | — | — |
| | No. 14 | — | — | — | — | — |
| | No. 15 | — | — | — | — | — |
| | No. 16 | — | — | — | — | — |
| | No. 17 | x | — | — | — | — |
| | No. 18 | — | — | — | — | — |
| | No. 19 | — | — | — | — | — |
| | No. 20 | — | — | — | — | — |

TABLE 12

| | | Lower layer | | | | |
|---|---|---|---|---|---|---|
| | | No. 21 | No. 22 | No. 23 | No. 24 | No. 25 |
| Upper layer | No. 1 | ○ | ○ | ○ | ○ | ○ |
| | No. 2 | ○ | ○ | ○ | ○ | ○ |
| | No. 3 | ○ | ○ | ○ | ○ | ○ |
| | No. 4 | ○ | — | — | — | — |
| | No. 5 | ○ | — | ○ | — | — |
| | No. 6 | ○ | — | — | — | — |
| | No. 7 | — | — | ○ | — | — |
| | No. 8 | ○ | — | ○ | — | — |
| | No. 9 | — | — | ○ | — | — |
| | No. 10 | — | — | — | — | — |
| | No. 11 | — | — | — | — | — |
| | No. 12 | — | — | — | — | — |
| | No. 13 | — | — | — | — | — |
| | No. 14 | — | — | — | — | — |
| | No. 15 | — | — | — | — | — |
| | No. 16 | — | — | — | — | — |
| | No. 17 | — | — | — | — | — |
| | No. 18 | — | — | — | — | — |
| | No. 19 | — | — | — | — | — |
| | No. 20 | — | — | — | — | — |

TABLE 13

| | | Lower layer | | | | |
|---|---|---|---|---|---|---|
| | | No. 26 | No. 27 | No. 28 | No. 29 | No. 30 |
| Upper layer | No. 1 | ○ | ○ | ○ | ○ | ○ |
| | No. 2 | — | — | — | ○ | ○ |
| | No. 3 | ○ | ○ | ○ | ○ | ○ |
| | No. 4 | — | — | — | ○ | ○ |
| | No. 5 | — | — | — | ○ | ○ |
| | No. 6 | — | — | — | ○ | ○ |
| | No. 7 | — | — | — | ○ | ○ |
| | No. 8 | — | — | — | ○ | ○ |
| | No. 9 | — | — | — | ○ | ○ |
| | No. 10 | — | — | — | — | — |
| | No. 11 | — | — | — | — | — |
| | No. 12 | — | — | — | — | — |
| | No. 13 | — | — | — | — | — |
| | No. 14 | — | — | — | — | — |
| | No. 15 | — | — | — | — | — |
| | No. 16 | — | — | — | — | — |
| | No. 17 | — | — | — | — | — |

TABLE 13-continued

|  |  | Lower layer | | | | |
|---|---|---|---|---|---|---|
|  |  | No. 26 | No. 27 | No. 28 | No. 29 | No. 30 |
|  | No. 18 | — | — | — | — | — |
|  | No. 19 | — | — | — | — | — |
|  | No. 20 | — | — | — | — | — |

TABLE 14

|  |  | Lower layer | | | | |
|---|---|---|---|---|---|---|
|  |  | No. 1 | No. 2 | No. 3 | No. 4 | No. 5 |
| Upper | No. 1 | — | ○ | ○ | x | — |
| layer | No. 2 | ○ | — | — | ○ | ○ |
|  | No. 3 | ○ | — | — | ○ | ○ |
|  | No. 4 | — | ○ | ○ | — | — |
|  | No. 5 | Δ | ○ | ○ | — | — |
|  | No. 6 | — | ○ | ○ | — | — |
|  | No. 7 | — | ○ | ○ | — | — |
|  | No. 8 | ○ | ○ | ○ | ○ | ○ |
|  | No. 9 | — | ○ | ○ | — | — |
|  | No. 10 | — | — | — | — | — |
|  | No. 11 | x* | — | — | — | — |
|  | No. 12 | — | x* | — | — | — |
|  | No. 13 | — | — | — | — | — |
|  | No. 14 | — | — | x* | — | — |
|  | No. 15 | — | — | — | — | — |
|  | No. 16 | — | — | — | — | — |
|  | No. 17 | — | — | — | — | — |
|  | No. 18 | — | — | — | — | — |
|  | No. 19 | — | — | — | — | — |
|  | No. 20 | — | — | — | — | — |

*No upper layer was formed.

TABLE 15

|  |  | Lower layer | | | | |
|---|---|---|---|---|---|---|
|  |  | No. 6 | No. 7 | No. 8 | No. 9 | No. 10 |
| Upper | No. 1 | — | ○ | ○ | — | ○ |
| layer | No. 2 | ○ | ○ | ○ | ○ | x |
|  | No. 3 | ○ | ○ | ○ | ○ | — |
|  | No. 4 | — | ○ | ○ | — | ○ |
|  | No. 5 | — | ○ | ○ | — | ○ |
|  | No. 6 | — | ○ | ○ | — | ○ |
|  | No. 7 | — | — | x | — | ○ |
|  | No. 8 | ○ | x | — | ○ | ○ |
|  | No. 9 | — | ○ | ○ | — | ○ |
|  | No. 10 | — | — | — | — | — |
|  | No. 11 | — | — | — | — | — |
|  | No. 12 | — | — | — | — | — |
|  | No. 13 | — | — | — | — | — |
|  | No. 14 | — | — | — | — | — |
|  | No. 15 | x* | — | — | — | — |
|  | No. 16 | — | — | — | — | — |
|  | No. 17 | — | — | — | — | — |
|  | No. 18 | — | — | — | — | — |
|  | No. 19 | — | — | — | — | — |
|  | No. 20 | — | — | — | — | — |

*No upper layer was formed.

TABLE 16

|  |  | Lower layer | | | | |
|---|---|---|---|---|---|---|
|  |  | No. 11 | No. 12 | No. 13 | No. 14 | No. 15 |
| Upper | No. 1 | ○ | ○ | ○ | ○ | ○ |
| layer | No. 2 | x | x | x | x | ○ |
|  | No. 3 | — | — | — | — | ○ |
|  | No. 4 | ○ | ○ | ○ | ○ | ○ |
|  | No. 5 | ○ | ○ | ○ | ○ | ○ |
|  | No. 6 | ○ | ○ | ○ | ○ | ○ |
|  | No. 7 | ○ | ○ | ○ | ○ | — |
|  | No. 8 | ○ | ○ | ○ | ○ | — |
|  | No. 9 | ○ | ○ | ○ | ○ | ○ |
|  | No. 10 | — | — | — | — | — |
|  | No. 11 | — | — | — | — | — |
|  | No. 12 | — | — | — | — | — |
|  | No. 13 | — | — | — | — | — |
|  | No. 14 | — | — | — | — | — |
|  | No. 15 | — | — | — | — | — |
|  | No. 16 | — | — | — | — | x* |
|  | No. 17 | — | — | — | — | — |
|  | No. 18 | — | — | — | — | — |
|  | No. 19 | — | — | — | — | — |
|  | No. 20 | — | — | — | — | — |

*No upper layer was formed.

TABLE 17

|  |  | Lower layer | | | | |
|---|---|---|---|---|---|---|
|  |  | No. 16 | No. 17 | No. 18 | No. 19 | No. 20 |
| Upper | No. 1 | ○ | ○ | ○ | ○ | ○ |
| layer | No. 2 | ○ | — | — | — | — |
|  | No. 3 | ○ | — | — | — | — |
|  | No. 4 | ○ | ○ | ○ | ○ | ○ |
|  | No. 5 | ○ | ○ | ○ | ○ | ○ |
|  | No. 6 | ○ | ○ | ○ | ○ | ○ |
|  | No. 7 | — | ○ | ○ | ○ | ○ |
|  | No. 8 | — | ○ | ○ | ○ | ○ |
|  | No. 9 | ○ | ○ | ○ | ○ | ○ |
|  | No. 10 | — | — | — | — | — |
|  | No. 11 | — | — | — | — | — |
|  | No. 12 | — | — | — | — | — |
|  | No. 13 | — | — | — | — | — |
|  | No. 14 | — | — | — | — | — |
|  | No. 15 | — | — | — | — | — |
|  | No. 16 | — | — | — | — | — |
|  | No. 17 | x* | — | — | — | — |
|  | No. 18 | — | — | — | — | — |
|  | No. 19 | — | — | — | — | — |
|  | No. 20 | — | — | — | — | — |

*No upper layer was formed.

TABLE 18

|  |  | Lower layer | | | | |
|---|---|---|---|---|---|---|
|  |  | No. 21 | No. 22 | No. 23 | No. 24 | No. 25 |
| Upper | No. 1 | ○ | ○ | ○ | ○ | ○ |
| layer | No. 2 | ○ | ○ | ○ | ○ | ○ |
|  | No. 3 | ○ | ○ | ○ | ○ | ○ |
|  | No. 4 | ○ | — | — | — | — |
|  | No. 5 | ○ | — | ○ | — | — |
|  | No. 6 | ○ | — | — | — | — |
|  | No. 7 | — | — | ○ | — | — |
|  | No. 8 | ○ | — | ○ | — | — |
|  | No. 9 | — | — | ○ | — | — |
|  | No. 10 | — | — | — | — | — |
|  | No. 11 | — | — | — | — | — |
|  | No. 12 | — | — | — | — | — |
|  | No. 13 | — | — | — | — | — |
|  | No. 14 | — | — | — | — | — |
|  | No. 15 | — | — | — | — | — |
|  | No. 16 | — | — | — | — | — |
|  | No. 17 | — | — | — | — | — |
|  | No. 18 | — | — | — | — | — |

TABLE 18-continued

|  | Lower layer | | | | |
|---|---|---|---|---|---|
|  | No. 21 | No. 22 | No. 23 | No. 24 | No. 25 |
| No. 19 | — | — | — | — | — |
| No. 20 | — | — | — | — | — |

TABLE 19

|  |  | Lower layer | | | | |
|---|---|---|---|---|---|---|
|  |  | No. 26 | No. 27 | No. 28 | No. 29 | No. 30 |
| Upper layer | No. 1 | ○ | ○ | ○ | ○ | ○ |
|  | No. 2 | — | — | — | ○ | ○ |
|  | No. 3 | ○ | ○ | ○ | ○ | ○ |
|  | No. 4 | — | — | — | ○ | ○ |
|  | No. 5 | — | — | — | ○ | ○ |
|  | No. 6 | — | — | — | ○ | ○ |
|  | No. 7 | — | — | — | ○ | ○ |
|  | No. 8 | — | — | — | ○ | ○ |
|  | No. 9 | — | — | — | ○ | ○ |
|  | No. 10 | — | — | — | — | — |
|  | No. 11 | — | — | — | — | — |
|  | No. 12 | — | — | — | — | — |
|  | No. 13 | — | — | — | — | — |
|  | No. 14 | — | — | — | — | — |
|  | No. 15 | — | — | — | — | — |
|  | No. 16 | — | — | — | — | — |
|  | No. 17 | — | — | — | — | — |
|  | No. 18 | — | — | — | — | — |
|  | No. 19 | — | — | — | — | — |
|  | No. 20 | — | — | — | — | — |

TABLE 20

|  |  | Lower layer | | | | |
|---|---|---|---|---|---|---|
|  |  | No. 1 | No. 2 | No. 3 | No. 4 | No. 5 |
| Upper layer | No. 1 | — | ○ | ○ | Δ | — |
|  | No. 2 | ○ | — | — | ○ | ○ |
|  | No. 3 | ○ | — | — | ○ | ○ |
|  | No. 4 | — | ○ | ○ | — | — |
|  | No. 5 | Δ | ○ | ○ | — | — |
|  | No. 6 | — | ○ | ○ | — | — |
|  | No. 7 | — | ○ | ○ | — | — |
|  | No. 8 | ○ | ○ | ○ | ○ | ○ |
|  | No. 9 | — | ○ | ○ | — | — |
|  | No. 10 | — | — | — | — | — |
|  | No. 11 | x | — | — | — | — |
|  | No. 12 | — | x | — | — | — |
|  | No. 13 | — | — | — | — | — |
|  | No. 14 | — | — | x | — | — |
|  | No. 15 | — | — | — | — | — |
|  | No. 16 | — | — | — | — | — |
|  | No. 17 | — | — | — | — | — |
|  | No. 18 | — | — | — | — | — |
|  | No. 19 | — | — | — | — | — |
|  | No. 20 | — | — | — | — | — |

TABLE 21

|  |  | Lower layer | | | | |
|---|---|---|---|---|---|---|
|  |  | No. 6 | No. 7 | No. 8 | No. 9 | No. 10 |
| Upper layer | No. 1 | — | ○ | ○ | — | ○ |
|  | No. 2 | ○ | ○ | ○ | ○ | x |
|  | No. 3 | ○ | ○ | ○ | ○ | — |
|  | No. 4 | — | ○ | ○ | — | ○ |
|  | No. 5 | — | ○ | ○ | — | ○ |
|  | No. 6 | — | ○ | ○ | — | ○ |
|  | No. 7 | — | — | x | — | ○ |
|  | No. 8 | ○ | x | — | ○ | ○ |
|  | No. 9 | — | ○ | ○ | — | ○ |
|  | No. 10 | — | — | — | — | — |
|  | No. 11 | — | — | — | — | — |
|  | No. 12 | — | — | — | — | — |
|  | No. 13 | — | — | — | — | — |
|  | No. 14 | — | — | — | — | — |
|  | No. 15 | x | — | — | — | — |
|  | No. 16 | — | — | — | — | — |
|  | No. 17 | — | — | — | — | — |
|  | No. 18 | — | — | — | — | — |
|  | No. 19 | — | — | — | — | — |
|  | No. 20 | — | — | — | — | — |

TABLE 22

|  |  | Lower layer | | | | |
|---|---|---|---|---|---|---|
|  |  | No. 11 | No. 12 | No. 13 | No. 14 | No. 15 |
| Upper layer | No. 1 | ○ | ○ | ○ | ○ | ○ |
|  | No. 2 | x | x | x | x | ○ |
|  | No. 3 | — | — | — | — | ○ |
|  | No. 4 | ○ | ○ | ○ | ○ | ○ |
|  | No. 5 | ○ | ○ | ○ | ○ | ○ |
|  | No. 6 | ○ | ○ | ○ | ○ | ○ |
|  | No. 7 | ○ | ○ | ○ | ○ | — |
|  | No. 8 | ○ | ○ | ○ | ○ | — |
|  | No. 9 | ○ | ○ | ○ | ○ | ○ |
|  | No. 10 | — | — | — | — | — |
|  | No. 11 | — | — | — | — | — |
|  | No. 12 | — | — | — | — | — |
|  | No. 13 | — | — | — | — | — |
|  | No. 14 | — | — | — | — | — |
|  | No. 15 | — | — | — | — | — |
|  | No. 16 | — | — | — | — | x |
|  | No. 17 | — | — | — | — | — |
|  | No. 18 | — | — | — | — | — |
|  | No. 19 | — | — | — | — | — |
|  | No. 20 | — | — | — | — | — |

TABLE 23

|  |  | Lower layer | | | | |
|---|---|---|---|---|---|---|
|  |  | No. 16 | No. 17 | No. 18 | No. 19 | No. 20 |
| Upper layer | No. 1 | ○ | ○ | ○ | ○ | ○ |
|  | No. 2 | ○ | — | — | — | — |
|  | No. 3 | ○ | — | — | — | — |
|  | No. 4 | ○ | — | — | — | — |
|  | No. 5 | ○ | ○ | ○ | ○ | ○ |
|  | No. 6 | ○ | ○ | ○ | ○ | ○ |
|  | No. 7 | — | ○ | ○ | ○ | ○ |
|  | No. 8 | — | ○ | ○ | ○ | ○ |
|  | No. 9 | ○ | ○ | ○ | ○ | ○ |
|  | No. 10 | — | — | — | — | — |
|  | No. 11 | — | — | — | — | — |
|  | No. 12 | — | — | — | — | — |
|  | No. 13 | — | — | — | — | — |
|  | No. 14 | — | — | — | — | — |
|  | No. 15 | — | — | — | — | — |
|  | No. 16 | — | — | — | — | — |
|  | No. 17 | x | — | — | — | — |
|  | No. 18 | — | — | — | — | — |
|  | No. 19 | — | — | — | — | — |
|  | No. 20 | — | — | — | — | — |

TABLE 24

| | | Lower layer | | | | |
|---|---|---|---|---|---|---|
| | | No. 21 | No. 22 | No. 23 | No. 24 | No. 25 |
| Upper layer | No. 1 | ○ | ○ | ○ | ○ | ○ |
| | No. 2 | ○ | ○ | ○ | ○ | ○ |
| | No. 3 | ○ | ○ | ○ | ○ | ○ |
| | No. 4 | ○ | — | — | — | — |
| | No. 5 | ○ | — | ○ | — | — |
| | No. 6 | ○ | — | — | — | — |
| | No. 7 | — | — | ○ | — | — |
| | No. 8 | ○ | — | ○ | — | — |
| | No. 9 | — | — | ○ | — | — |
| | No. 10 | — | — | — | — | — |
| | No. 11 | — | — | — | — | — |
| | No. 12 | — | — | — | — | — |
| | No. 13 | — | — | — | — | — |
| | No. 14 | — | — | — | — | — |
| | No. 15 | — | — | — | — | — |
| | No. 16 | — | — | — | — | — |
| | No. 17 | — | — | — | — | — |
| | No. 18 | — | — | — | — | — |
| | No. 19 | — | — | — | — | — |
| | No. 20 | — | — | — | — | — |

TABLE 25

| | | Lower layer | | | | |
|---|---|---|---|---|---|---|
| | | No. 26 | No. 27 | No. 28 | No. 29 | No. 30 |
| Upper layer | No. 1 | ○ | ○ | ○ | ○ | ○ |
| | No. 2 | — | — | — | ○ | ○ |
| | No. 3 | ○ | ○ | ○ | ○ | ○ |
| | No. 4 | — | — | — | ○ | ○ |
| | No. 5 | — | — | — | ○ | ○ |
| | No. 6 | — | — | — | ○ | ○ |
| | No. 7 | — | — | — | ○ | ○ |
| | No. 8 | — | — | — | ○ | ○ |
| | No. 9 | — | — | — | ○ | ○ |
| | No. 10 | — | — | — | — | — |
| | No. 11 | — | — | — | — | — |
| | No. 12 | — | — | — | — | — |
| | No. 13 | — | — | — | — | — |
| | No. 14 | — | — | — | — | — |
| | No. 15 | — | — | — | — | — |
| | No. 16 | — | — | — | — | — |
| | No. 17 | — | — | — | — | — |
| | No. 18 | — | — | — | — | — |
| | No. 19 | — | — | — | — | — |
| | No. 20 | — | — | — | — | — |

From the results shown above, it is apparent that the patterns obtained by the pattern-forming method of the present invention have excellent lamination properties, photolithographic properties (sensitivity, resolution and developability), gas barrier properties, solvent resistance and the like.

DESCRIPTION OF SYMBOLS

1: Substrate
2: First layer
3: Second layer

The invention claimed is:

1. A pattern-forming method comprising:
   the step (1) of forming a film using a composition on a support;
   the exposure step (2) of irradiating a prescribed part of said film with an active energy ray to modify the developability of said prescribed part; and
   the development step (3) of developing said film to obtain a pattern,
   which steps (1) to (3) are repeatedly performed a plurality of times,
   wherein,
   a plurality of compositions that differ in solubility to a developing solution are used as said composition, and the resulting pattern has a multilayer structure, and
   wherein
   said step (1) is the step of coating said support with a lower layer composed of a water-soluble composition or a water-developable photosensitive composition and subsequently with an upper layer composed of an alkali-developable photosensitive composition or an organic solvent-developable photosensitive composition, and
   said step (3) comprises the development step of developing or dissolving said upper layer to obtain a pattern: and the developments step of subsequently developing or dissolving said lower layer to obtain a pattern.

2. The pattern-forming method according to claim 1, wherein the uppermost layer of said multilayer structure is obtained from an organic solvent-developable photosensitive composition, or an alkali-developable photosensitive composition.

3. The pattern-forming method according to claim 1, said method comprising the heating step between said step (1) and said step (2), and/or after said step (3).

4. The pattern-forming method according to claim 1, wherein
   said water-soluble composition, if present, comprises a binder resin and water.

5. The pattern-forming method according to claim 4, wherein said water-soluble composition further comprises a cross-linking agent.

6. The pattern-forming method according to claim 5, wherein said cross-linking agent is an oxazoline compound or a carbodiimide compound.

7. The pattern-forming method according to claim 1, wherein said organic solvent-developable photosensitive composition, if present, comprises: a radical polymerizable compound or a cationically polymerizable compound; and a polymerization initiator.

8. The pattern-forming method according to claim 1, wherein said alkali-developable photosensitive composition, if present, comprises, at least: an alkali-developable binder resin; a polymerization initiator; and a solvent.

9. The pattern-forming method according to claim 1, wherein said water-developable photosensitive composition, if present, comprises: a photosensitive group-containing water-soluble polymer; and water.

10. The pattern-forming method according to claim 1, wherein said active energy ray has an energy of 0.1 to 500,000 mJ/cm$^2$.

11. The pattern-forming method according to claim 1, wherein said multilayer structure of said resulting pattern has a film thickness of 0.1 to 1,000 μm, a line width of 1 to 1,000 μm and a spacing of 1 to 1,000 μm.

12. The pattern-forming method according to claim 1, wherein the film thickness ratio of said upper layer and said lower layer is 0.1:99.9 to 99.9:0.1.

* * * * *